United States Patent
Dinh et al.

(10) Patent No.: US 9,793,070 B2
(45) Date of Patent: Oct. 17, 2017

(54) DOME SWITCH STACK AND METHOD FOR MAKING THE SAME

(71) Applicant: Apple Inc., Cupertino, CA (US)

(72) Inventors: Richard Hung Minh Dinh, San Jose, CA (US); Lee E. Hooton, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 638 days.

(21) Appl. No.: 13/788,040

(22) Filed: Mar. 7, 2013

(65) Prior Publication Data

US 2014/0252881 A1 Sep. 11, 2014

(51) Int. Cl.
| | | |
|---|---|---|
| *H01H 13/88* | (2006.01) | |
| *H01H 13/06* | (2006.01) | |
| *H01H 13/86* | (2006.01) | |
| *H03K 17/96* | (2006.01) | |
| *H03K 17/955* | (2006.01) | |

(52) U.S. Cl.
CPC ............ *H01H 13/06* (2013.01); *H01H 13/86* (2013.01); *H01H 13/88* (2013.01); *H03K 17/955* (2013.01); *H03K 17/962* (2013.01); *H01H 2215/006* (2013.01); *H01H 2223/002* (2013.01); *H01H 2229/036* (2013.01); *H01H 2239/006* (2013.01); *H01H 2239/074* (2013.01); *H03K 2217/96054* (2013.01); *Y10T 29/49105* (2015.01); *Y10T 307/826* (2015.04)

(58) Field of Classification Search
CPC ..................................................... H03K 17/955
See application file for complete search history.

(56) References Cited

U.S. PATENT DOCUMENTS

| | | | |
|---|---|---|---|
| 4,029,916 A | | 6/1977 | Chu |
| 4,197,439 A | * | 4/1980 | Mecklenburg ......... H01H 13/83 200/292 |
| 4,814,566 A | | 3/1989 | Sigl |
| 4,843,197 A | | 6/1989 | Kojima et al. |
| 5,152,392 A | * | 10/1992 | Iwasa ................... H01H 13/705 200/329 |
| 5,432,303 A | * | 7/1995 | Turek et al. ................... 174/259 |
| 6,133,536 A | * | 10/2000 | Hunag et al. ................. 200/5 A |
| 6,329,722 B1 | * | 12/2001 | Shih et al. .................... 257/786 |
| 6,425,772 B1 | * | 7/2002 | Bernier et al. .................. 439/91 |
| 6,459,566 B1 | | 10/2002 | Casby et al. |
| 6,600,120 B1 | | 7/2003 | Marmaropoulos |
| 6,659,229 B2 | | 12/2003 | Rzeppa |
| 6,747,218 B2 | | 6/2004 | Huseman et al. |
| 6,936,783 B2 | | 8/2005 | Kawaguchi et al. |
| 7,094,985 B2 | | 8/2006 | Kobayashi et al. |
| 7,151,236 B2 | | 12/2006 | Ducruet et al. |
| 7,378,609 B1 | | 5/2008 | Fedorjaka |
| 7,402,764 B2 | | 7/2008 | Pihlaja et al. |

(Continued)

*Primary Examiner* — Thienvu Tran
*Assistant Examiner* — Pinping Sun
(74) *Attorney, Agent, or Firm* — Brownstein Hyatt Farber Schreck, LLP

(57) ABSTRACT

Systems and methods for providing input component assemblies for dome switches are provided. In some embodiments, an input component assembly may include a first conductive contact pad coupled to a first board of a switch, a second conductive contact pad coupled to a second board of the switch, and a layer of conductive adhesive between the first conductive pad and the second conductive pad, where the layer is operative to provide a seal for the switch.

15 Claims, 16 Drawing Sheets

(56) References Cited

U.S. PATENT DOCUMENTS

| | | | |
|---|---|---|---|
| 7,557,320 B1* | 7/2009 | Crooijmans | H01H 13/85 200/406 |
| 7,902,474 B2* | 3/2011 | Mittleman et al. | 200/516 |
| 8,246,383 B2* | 8/2012 | Schmidt et al. | 439/607.35 |
| 8,269,124 B2* | 9/2012 | Jung | H01H 13/78 200/513 |
| 8,339,798 B2* | 12/2012 | Minoo et al. | 361/764 |
| 8,367,957 B2* | 2/2013 | Strittmatter | 200/515 |
| 8,450,627 B2* | 5/2013 | Mittleman et al. | 200/600 |
| 8,502,099 B2* | 8/2013 | Lin | H01H 1/64 200/302.2 |
| 8,552,321 B2 | 10/2013 | Low et al. | |
| 8,569,638 B2 | 10/2013 | Prest et al. | |
| 8,754,342 B2* | 6/2014 | Heiskanen | H01H 13/14 200/406 |
| 8,766,124 B2 | 7/2014 | Alvarez et al. | |
| 8,886,031 B2* | 11/2014 | Pope et al. | 396/535 |
| 2005/0224762 A1 | 10/2005 | Hasegawa | |
| 2006/0185971 A1 | 8/2006 | Rochon et al. | |
| 2007/0207306 A1* | 9/2007 | Broughton | B32B 5/18 428/304.4 |
| 2008/0230363 A1 | 9/2008 | Yang | |
| 2009/0078553 A1 | 3/2009 | Sanford et al. | |
| 2009/0266699 A1* | 10/2009 | Rothkopf et al. | 200/534 |
| 2010/0151176 A1 | 6/2010 | Ly et al. | |
| 2010/0300859 A1 | 12/2010 | Prest et al. | |
| 2011/0079496 A1* | 4/2011 | Lin et al. | 200/302.1 |
| 2011/0132736 A1* | 6/2011 | Mittleman | H01H 13/79 200/345 |
| 2011/0147188 A1* | 6/2011 | Kato | H01H 13/64 200/5 A |
| 2011/0194710 A1 | 8/2011 | Prest et al. | |
| 2011/0241442 A1 | 10/2011 | Mittleman et al. | |
| 2011/0247926 A1 | 10/2011 | Osborn | |
| 2011/0297525 A1 | 12/2011 | Tsai et al. | |
| 2012/0306802 A1 | 12/2012 | McCracken | |

* cited by examiner

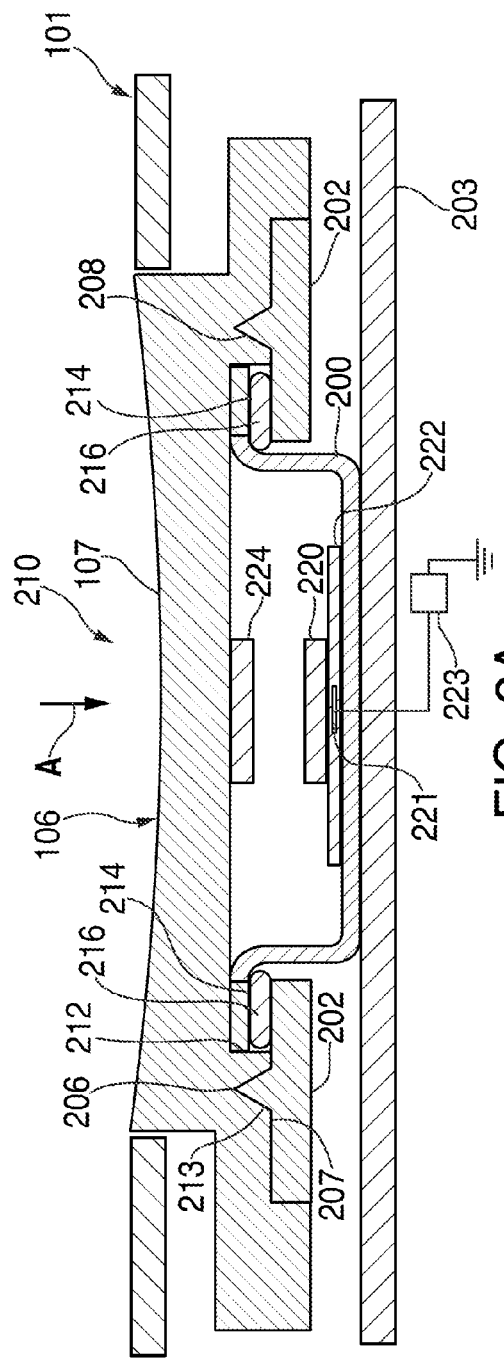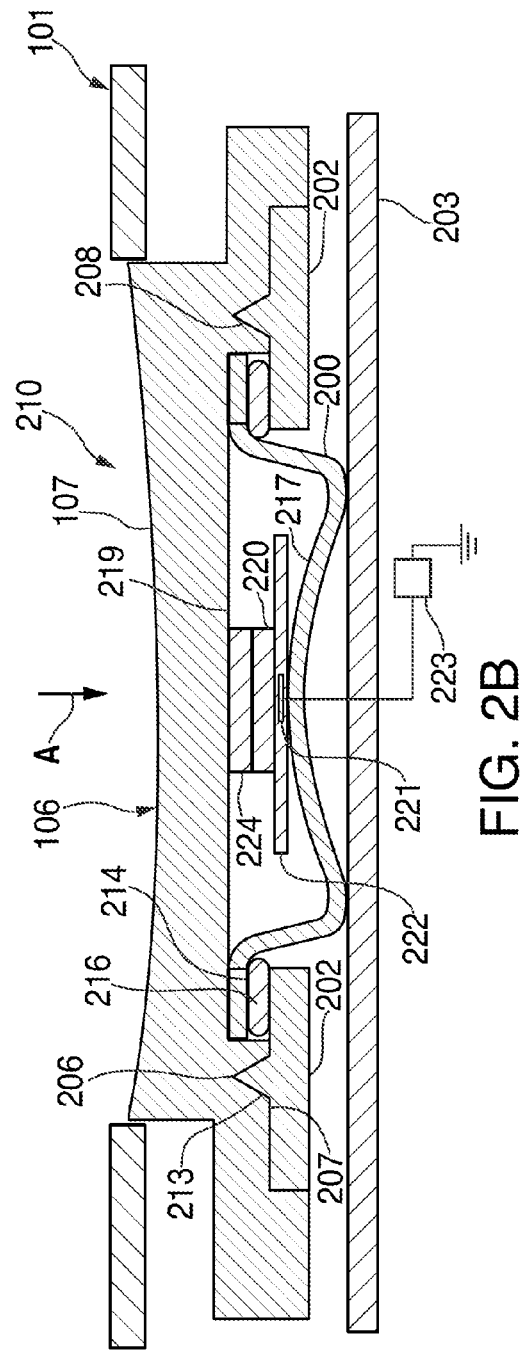

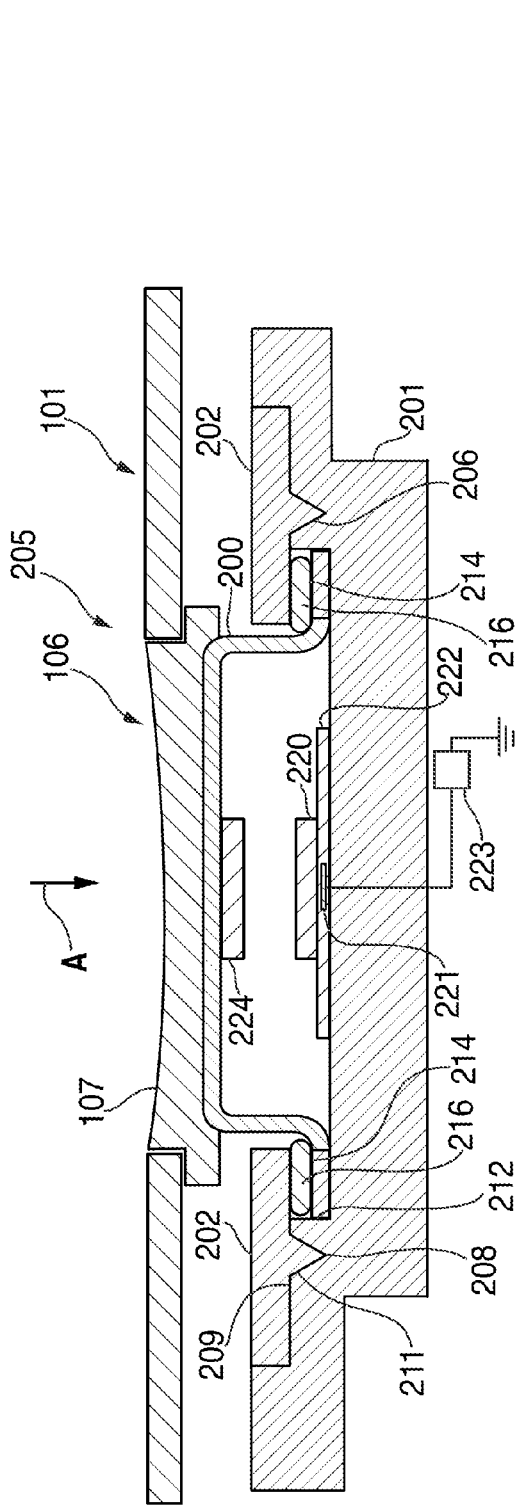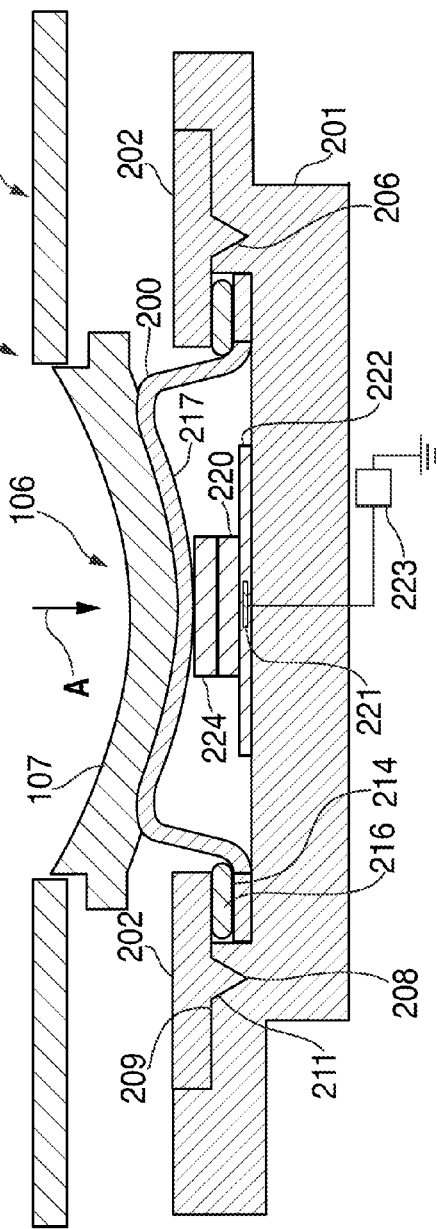
FIG. 3A
FIG. 3B

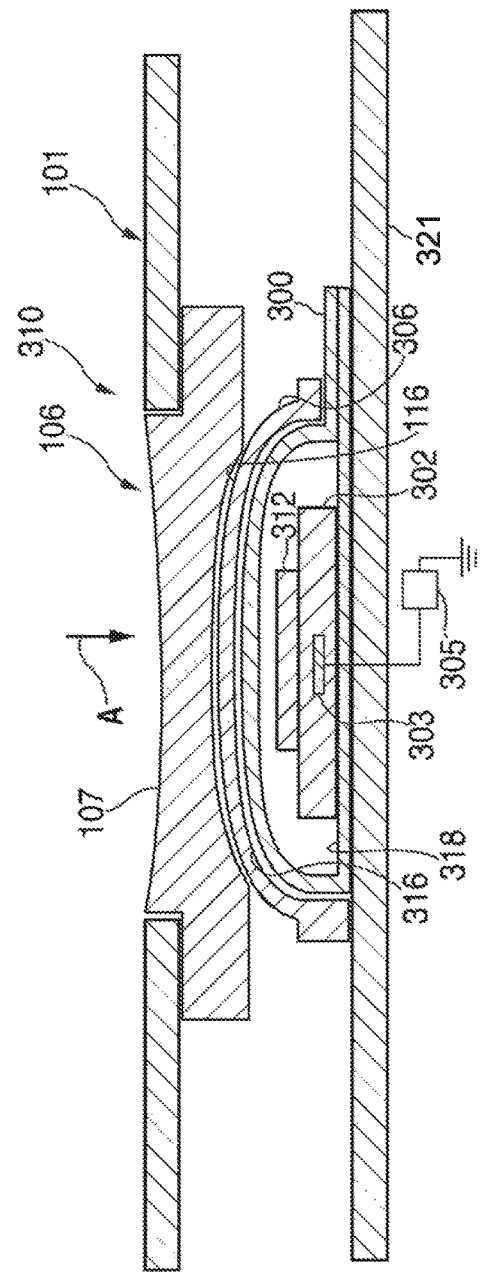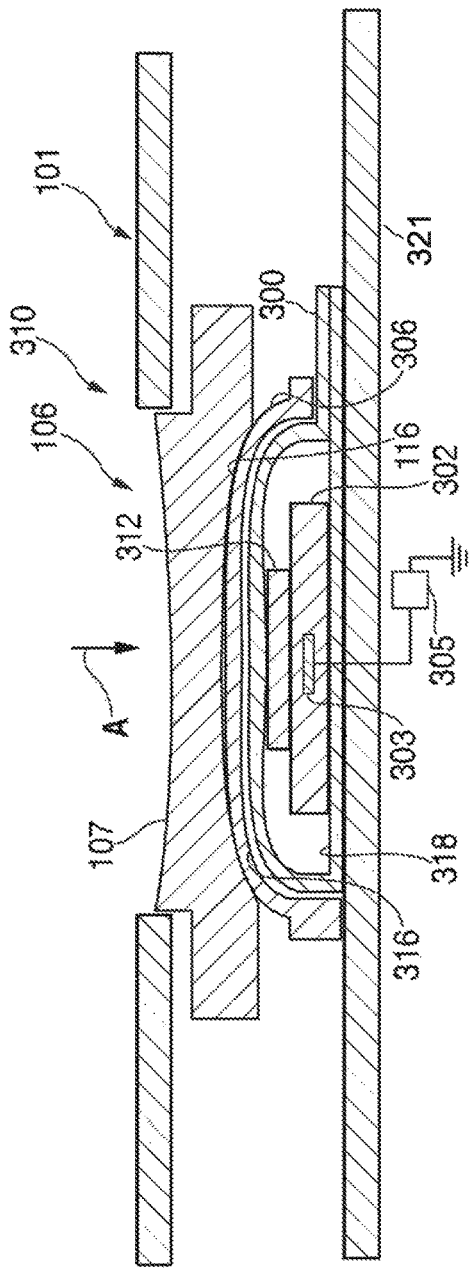

DOME SWITCH STACK AND METHOD FOR MAKING THE SAME

FIELD OF THE INVENTION

This can relate to systems and methods for providing input component assemblies in electronic devices and, more particularly, to systems and methods for providing input component assemblies with dome switches in electronic devices.

BACKGROUND

Dome switches may be used in various electronic devices (e.g., portable media players and cellular telephones). A dome switch generally has a dome with a conductive inner surface operative to close a circuit when the dome is deformed and/or pressed. Upon depression of the dome or deformation of the dome, the conductive inner surface is brought in contact with a conductive pad positioned under the dome. The conductive pad may be provided on a circuit board of an electronic device, and when the conductive inner surface is brought in contact with the conductive pad to form a connection, the circuit of the switch can provide electrical signals to other components of the electronic device.

Electronic devices with dome switches invariably come in to contact with liquids, oils, and other elements that can corrode the switch. Dome switches may become corroded when liquids and oils seep in to crevices around switch during use and/or when exposed to oils and/or liquids during assembly of the dome switch. If the switch becomes corroded, then forming a connection is made more difficult, if not, impossible. Thus, there is a need to provide a dome switch resistant to liquid and other corrosive elements.

SUMMARY

Systems and methods for providing input component assemblies for dome switches are provided. In some embodiments, an input component assembly may include a first conductive contact pad coupled to a first board of a switch, a second conductive contact pad coupled to a second board of the switch, and a layer of conductive adhesive between the first conductive pad and the second conductive pad, where the layer is operative to provide a seal for the switch.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which:

FIG. 2A is a cross sectional view of switch assembly 110 with sonic weld joints (denoted as 210) taken across line II-II of FIG. 1A in accordance with some embodiments of the invention;

FIG. 2B is a cross sectional view of switch assembly 110 with sonic weld joints (denoted as 210) taken across line II-II of FIG. 1A in accordance with some embodiments of the invention;

FIG. 3A is a cross sectional view of an alternative embodiment of switch assembly 110, similar to FIG. 2A, with sonic weld joints (denoted as 205) taken across line II-II of FIG. 1A in accordance with some embodiments of the invention;

FIG. 3B is a cross sectional view of switch assembly 110, similar to FIG. 2B, with sonic weld joints (denoted as 205) taken across line II-II of FIG. 1A in accordance with some embodiments of the invention;

FIG. 8 is a cross sectional view of switch assembly 110 using conductive covering (denoted as 310) taken across line II-II of FIG. 1A in accordance with some embodiments of the invention;

FIG. 9 is a cross sectional view of switch assembly 110 using conductive covering (denoted as 310) taken across line II-II of FIG. 1A in accordance with some embodiments of the invention;

DETAILED DESCRIPTION OF THE DISCLOSURE

An input component assembly that is resistant to liquids, oils, and corrosive elements (e.g., gases) and methods for making the same are disclosed. Conductive adhesive, sonic weld joints, and/or conductive enclosures for input component elements (e.g., switch elements) may serve to protect input component elements from liquids, oils, and/or other corrosive elements in embodiments of the invention. In one or more embodiments, a water resistant and/or hermetic seal may be formed around switch elements to serve as protection for the switch.

Figure 1A:
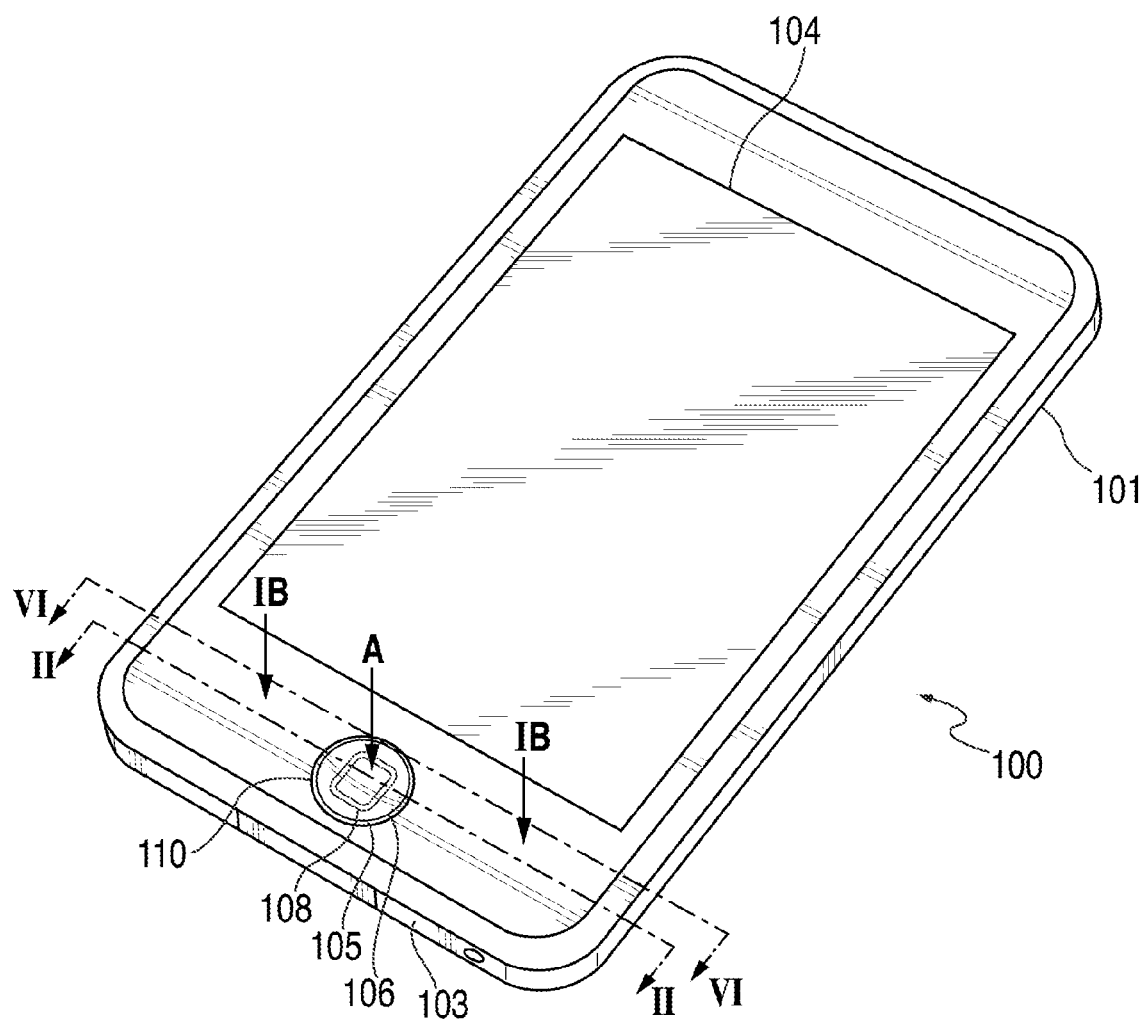
FIG. 1A is a perspective view of an exemplary electronic device in accordance with some embodiments of the invention.

FIG. 1A is a perspective view of an exemplary electronic device in accordance with some embodiments of the invention. Electronic device 100 can be any suitable device capable of receiving inputs through one or more input component assemblies, such as switch assembly 110. The term electronic device can include, but is not limited to, media players, video players, still image players, game players, music recorders, voice recorders, cameras, radios, medical equipment, domestic appliances, vehicle instruments, musical instruments, calculators, cellphones, wireless communication devices, personal digital assistants, programmable remotes, pagers, laptops, computers, printers, and/or any combination thereof. Electronic device 100 may have a single function or multiple functions.

In one or more embodiments, electronic device 100 may be any portable, mobile, hand-held, or miniature mobile electronic device. Miniature devices may have a form factor that is smaller than a hand held device, such as an iPod™ Shuffle available by Apple Inc. of Cupertino, Calif. Illustrative miniature devices may be incorporated into various objects that include, but are not limited to, the following: watches, rings, necklaces, belts, headsets, shoe accessories, virtual reality devices, other wearable electronics, sports or fitness equipment accessories, key chains, or any combination thereof. Alternatively, electronic device 100 may not be portable at all.

As shown in FIG. 1A, electronic device 100 can be hexahedral. Although, it should be noted that housing 101 is only exemplary and need not be substantially hexahedral. Housing 101 can be formed in any other shape, including, but not limited to, the following: spherical, ellipsoidal, conodial, octahedral, or any combination thereof, for example.

Electronic device 100 can include one or more additional components, some of which may be configured to be controlled by one or more input component assemblies of device 100. For example, electronic device 100 may include a switch assembly 110 that can allow a user to manipulate at least one function of electronic device 100, one or more output component 104 assemblies that can provide the user with device generated information, and at least one protective housing 101 that can at least partially enclose a particular input component of switch assembly 110, and output component 104. Switch assembly 110 may be a dome switch assembly or any other type of switch assembly having an actuator that may be depressed or deformed to close an otherwise open circuit of device 100, or to open an otherwise closed circuit. Switch assembly 110 may be made from any suitable material, including, but not limited to, metal, plastic, glass, or any combination thereof.

As shown in FIG. 1A, switch assembly 110 may include a button 106 that may be positioned within or at least partially exposed through an opening 105 of housing 101. Button 106 is circular and fits within circular opening 105. Although depicted as circular, those with skill in the art will recognize that both button 106 and opening 105 can have a variety of shapes, such as square, rectangular, or any other shape. A top surface 107 of button 106 can have an icon 108 to indicate the location of button 106 and/or to represent functionality provided by button 106. For example, button 106 may be made from the same material and have the same color as housing 101 and icon 108 may allow a user to locate button 106 on device 100 and differentiate button 106 from housing 101.

Icon 108 can be any type of symbol, letter, numeral, text, shape, and/or any other representation or combination thereof. Icon 108 may be a representation of a functionality offered by device 100 and the functionality can be provided (e.g., instructions can be executed to provide functionality) when the user interacts with button 106. Button 106 may be positioned within device 100 to ensure that icon 108 is properly aligned relative to the other components of device 100. For example, as shown in FIG. 1, when icon 108 is properly aligned, each of the four sides for icon 108 may appear to run parallel to corresponding sides of device 100, and the curved edges of icon 108 may appear to be aligned with curved edges of device 100. In another example, icon 108 may be text and proper alignment of button 106 within device 100 may give the appearance that the text of icon 108 is written on an imaginary line running parallel to a bottom side 103 of device 100.

Continuing with FIG. 1A, a force or pressure may be exerted by a user or an object in the direction of arrow A on top surface 107 of button 106 (e.g., in a direction perpendicular to a surface of housing 101 about button 106), and in some embodiments, this pressure exertion may depress or deform an actuator of a switch that may be positioned below button 106 within housing 101 to actuate the switch. The switch may be positioned under the physical input element of switch assembly 110 (e.g., button 106) such that, when button 106 is depressed due to the user input force in the direction of arrow A, the switch may close an electrical circuit. By way of example, a switch can include a dome that may be positioned over a contact pad such that, when the dome is deformed with the application of force in the direction of arrow A via button 106, the dome may come into physical contact with the contact pad and may close a circuit. The dome may provide a tactile resistance that the user must overcome to at least partially invert the dome. In other embodiments, a dome may not be used underneath the button. For example, button 106 may be positioned over a flexible circuit board that may be compressed and brought in to contact with a contact pad below to complete the circuit.

A switch may be actuated when a change of state is detected and/or measured either in addition to or instead of being actuated with direct contact as described above. A capacitor may be defined between switch elements and/or switch elements and a finger of a user. A sensing mechanism may be placed below the button 106 to detect the change in state (e.g., change in capacitance). For example, a capacitor may be defined between a dome and a terminal in a circuit board, between opposing terminals, between a finger and a terminal, between a terminal and a contact area, and/or between any other elements of a switch. Detection circuitry or a controller coupled to the switch can measure a change in capacitance between the conductors due to the change in distance between the conductors, and can interpret the change in capacitance as a user presses the button 106 of the dome switch. After interpreting the change in state (e.g., capacitance), the controller can cause a circuit to close. In some embodiments, capacitive sensing circuitry or a controller can be coupled with or incorporated in switch to detect an input when a user applies a force to the dome.

Button 106 may be depressed, touched, and/or a user or an object may be moved into close proximity to the button 106 (e.g., a finger or a stylus moved close to the button) allowing for detection of a change in a particular state (e.g., change in capacitance, change in electrical current, change in light sensed, sound waves, etc.), and the change in state (e.g., increase in capacitance, light sensed, etc.) may be detected and trigger completing a circuit. By way of example, a user's finger placed over the button 106 may serve as a conductor of a capacitor that may trigger completing a circuit. In another example, movement of a contact area toward an opposing terminal (e.g., a terminal positioned on a circuit boards beneath a conductive pad) closer together may cause a change in capacitance that can be detected and trigger closing a circuit. Reducing the distance between the contact area and an opposing terminal may cause a change in capacitance that can be detected and trigger opening a circuit.

Figure 1B:
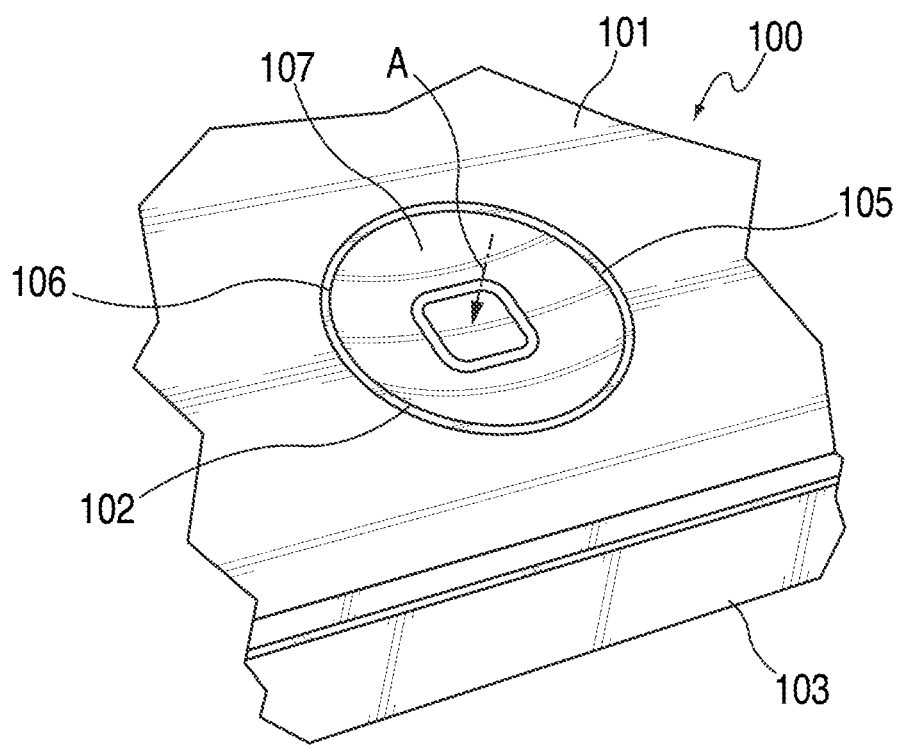
FIG. 1B is a top perspective view of a portion of the electronic device of FIG. 1A, taken from line IB-IB of FIG. 1A, in accordance with some embodiments of the invention.

FIG. 1B is a top perspective view of a portion of the electronic device of FIG. 1A, taken from line IB-IB of FIG. 1A, in accordance with some embodiments of the invention. Button 106 of switch assembly 110 may sit within opening 105 in housing 101 of device 100. Icon 108 may be aligned within opening 105 such that the bottom of icon 108 may run parallel to bottom side 103 of device 100.

A user can activate switch of switch assembly 110 by exerting force on top surface 107 of button 106 in the direction of A. For example, force applied to top surface 107 may depress or deform actuator of switch assembly 110 from an original, undepressed position to an actuated, depressed position to change a functional state of device 100, such as to turn device 100 off or on. Continuing with the example, actuator may be dome shaped, conical shaped, and/or have any other shape that can be deformed to move contact areas closer together and return to an original position. When a user terminates the force applied at top surface 107, actuator of switch assembly 110 may return to its original position.

In another example, a user may touch and/or come into close proximity to top surface 107 of button 106 of switch assembly 110, and a change of state that is being monitored (e.g., capacitance) may be detected. In particular, a finger placed on the button 106 and a terminal in a circuit board may define a capacitor, and a change in capacitance may be detected when a user touches button 106 at top surface 107 such that movement of the dome may not be relevant to detecting actuation. In some embodiments, a terminal opposing a contact area that is positioned beneath button 106 may define a capacitor, and a change in capacitance may be detected when a user moves the terminal and the contact area closer together to change the distance between conductors resulting in a change in capacitance.

A terminal can be electrically connected to any suitable electronic device component to provide a signal indicating that a user has provided an input to switch (e.g., that the user has caused dome to deflect). In some embodiments, terminal can be electrically connected to a controller operative to detect a change in electrical attributes associated with terminal when button 106 is depressed. The controller can detect and/or measure any suitable electrical attribute of the terminal including, for example, changes in value of voltage, current, resistance, power, capacitance, impedance, or combinations of these. The particular electrical attribute detected can include direct contact of components with contact area above terminal (e.g., direct contact to change resistance), or indirect interactions with the terminal (e.g., changing the distance between conductors to change capacitance). After interpreting the change, the controller can complete the circuit or open the circuit.

Invariably, with use, device 100 may come into contact with corrosive elements that can harm device 100 (e.g., corrosive elements may seep in through hole 105), and if left undeterred, corrosive elements may ingress through actuator (e.g., dome sheet of a dome switch) to contaminate switch of switch assembly 110. Various embodiments for switch assembly 110 will be described with FIGS. 2A-22 that reduces susceptibility to corrosion of the switch assembly 110.

FIG. 2A is a cross sectional view of switch assembly 110 with sonic weld joints (denoted as 210) taken across line II-II of FIG. 1A in accordance with some embodiments of the invention. Switch assembly 210 may have a weld plate 202 coupled to an underside surface 207 of button 106 at one or more sonic weld joints (e.g., as depicted with 206 and 208) to form a seal around switch assembly 210 elements. At each weld joint 206 and 208, a portion of a top surface (e.g., as depicted with 207) of weld plate 202 and a portion of underside surface (e.g., as depicted with 213) of button 106 may be welded together at sonic weld joints 206 and 208. Welding at sonic weld joints 206 and 208 may cause the materials to melt at the welding area and form a hermetic seal and/or liquid resistant seal around switch assembly 210 elements and may protect switch assembly 210 elements from corrosive elements. For example, weld plate 202 and button 106 may secure a lip of actuator (e.g., as depicted with 214) in place, and actuator 200 and button 106 may partially enclose or completely enclose switch elements of switch assembly 210 to ensure that corrosive elements are not able to ingress actuator 200.

Weld plate 202 and portions of button 106 at sonic weld joints 206 and 208 may be created out of plastic, metal, any other material, or combination of materials that allows for sonic welding. Although FIG. 2A illustrates a particular joint design, those with skill in the art will recognize that any other sonic weld joint design or configuration can be used for mating surfaces (e.g., bottom surface 213 of button 106 and top surface 207 of weld plate 202) for sonic welding. Joint designs may include, but are not limited to, the following: shear joint, step joint, tongue and groove, and/or any other type of joint design.

Sonic weld joints may be disposed around switch assembly 210 elements and/or actuator 200 to create a seal for the switch. Actuator 200 may have a three dimensional shape that at least partially encloses switch assembly 210 elements. For example, actuator 200 may be a dome-shaped actuator 200 to enclose a circuit board and/or contact areas and may be secured to fit against the underside surface of button 106 to enclose switch elements. Actuator 200 may be formed from metal, plastic, flexible material that allows actuator 200 to deform, and/or any other material or combination thereof.

When force is exerted on actuator 200, actuator 200 may deform allowing first contact area 220 and second contact area 224 of switch assembly 210 to move closer together. Further deformation of actuator 200, in some embodiments, may allow opposing electrical contact areas (e.g., first contact areas 220 and second contact areas 224) within switch assembly 210 to come into physical contact and electrically connect to close a circuit. In addition to or instead of closing a circuit with physical contact between opposing contact areas, force exerted on actuator 200 may allow second contact area 224 and terminal 221 to move closer together to cause a change in state, such as an increase in capacitance, and detection of the change in state may trigger closing a circuit.

A capacitor may be defined between contact area 224 and terminal 221 (e.g., beneath contact area 220). For example, terminal 221 may be positioned on the surface of circuit board 222 or within a stack of layer that create circuit board 222 and contact area 224 may be positioned opposite terminal 221. In some embodiments, terminal 221 can be electrically connected to controller 223 operative to detect and/or measure a change in electrical attributes associated with terminal 221 when button 106 is depressed and/or released, and the detection of which may trigger closing or opening a circuit in response to the detected and/or measured change.

At rest in an original state, electrical contact areas 220 and 224 of switch assembly 210 are separated and the switch is said to be electrically "open." In some embodiments, when actuator 200 is compressed against support surface 203 to a point where actuator 200 deforms, opposing electrical contact areas 220 and 224 of the switch may be moved to be in physical and electrical contact to complete an electrical circuit between opposing contact areas 220 and 224, and are said to electrically "close" the switch. The switch may also or instead be triggered by movement of second contact area 224 and terminal 221 (e.g., beneath first contact area 220) closer together to change a state (e.g., capacitance) and detection of the change by the controller 223 may cause the controller 223 to close the circuit. And, when second contact area 224 and terminal 221 (e.g., beneath first contact area 220) move further apart, the controller 223 detects that change in capacitance as well and opens the circuit.

Actuator 200 may compress when contact force is exerted on actuator 200 from above at top surface 107 of button 106 for switch assembly 210. Force may be applied to button 106 by a user from above in a direction of arrow A causing actuator 200 to deform. For example, a user may apply force on actuator 200 by depressing button 106 within housing 101, and actuator 200 may deform when the force against button 106 causes actuator 200 to come into contact with support surface 203 and deform. FIG. 2B below provides more detail on a deformed actuator 200 that may create an electrical connection between contact areas 220 and 224.

A portion of actuator 200 may fit within gap 212 or a cavity provided between weld plate 202 and button 106. In some embodiments, actuator 200 may have interference element 216 that fits within gap 212, and actuator 200 may move towards or away from interference element 216 when a user interacts with button 106. The portion of actuator 200 that fits within the gap may be a lip 214 and/or an edge of actuator 200 that can fit within gap 212 and is positioned above interference element 216. Interference element 216 provides interference when actuator 200 deforms or moves within gap 212, and interference element 216 may act as an additional seal for switch assembly 210.

In one or more embodiments, as shown in FIG. 2A, interference element 216 may be an O-ring. O-ring or toric joint may be a mechanical gasket that is shaped like a torus with a disc-like cross-section. Interference element 216 may be sized and have a particular shape to provide a substantially guaranteed interference fit for actuator 200.

One or more electrical contact areas (e.g., 220 and 224), such as copper coated conductive pads, may be coupled to a circuit board (e.g., circuit board 222) that fits underneath button 106. Circuit board, as used herein, may refer to a flexible or a rigid printed circuit board. Circuit boards can have conductive silicon glued to the board and/or have silicon with traces. Circuit boards (e.g., circuit board 222) can extend away from switch assembly 210 and can support and interconnect with any desired amounts of circuitry (e.g., controller 223) for device 100. For example, circuit board 222 may fit on inner surface 217 of actuator 200 and have electrical contact area 220, such as one or more conductive pads that are coupled to the circuit board. In some embodiments, contact area 224 may electrically connect when put in contact with another opposing electrical contact area (e.g., contact area 220) and/or detection of a change in state between contact area 224 and terminal 221 (e.g., beneath contact area 220) may trigger the switch. In an embodiment, conductive contact pads of contact area 220 are copper coated conductive pads positioned over terminal 221, and contact area 224 is a conductive material applied to underside surface of button 106.

FIG. 2B is a cross sectional view of switch assembly 210 with sonic weld joints taken across line II-II of FIG. 1A in accordance with some embodiments of the invention. FIG. 2B illustrates an actuator 200 of switch assembly 210 in an actuated state. When actuator 200 is in the actuated state, actuator 200 is deformed causing contact areas 220 and 224 to move closer together. Movement of contact area 224 and terminal 221 (e.g., beneath contact area 220) closer together may cause a change in state (e.g., increase capacitance) and the detected change in state by the controller 223 may cause the controller 223 to close the switch in some embodiments. Force applied to top surface 107 of button 106 in the direction of arrow A may cause actuator 200 to decompress. Enough force may be applied to top surface 107 of button 106, and, in turn, causing actuator 200 to contact support surface 203 resulting in deformation of actuator 200 thereby allowing contact areas 220 and 224 to be put in sufficient physical contact and the switch may close.

In an embodiment, pressure may be applied to top surface 107 of button 106 and actuator 200 may move toward support surface 203 thereby causing lip 214 to compress against interference element 216. Interference element 216 may be designed to handle the application of pressure. For example, interference element 216 may deform and/or absorb some of the pressure when force is applied. Interference element 216 may return to the original state after application of pressure ceases. When application of pressure ceases, actuator 200, button 106 and interference element 216 may return to original position as depicted in FIG. 2A.

Although particular examples of switch assembly 210 elements are provided, those with skill in the art will recognize that any number of switch designs are available with switch elements at least partially enclosed by actuator 200 and button 106 with sonic weld joints between weld plate 202 and button 106 to provide a seal for the switch. For example, switch assembly 210 may have a first circuit board 222 mounted to inner surface 217 of actuator 200 having a first contact area 220 positioned under a second contact area 224 coupled to a second circuit board mounted to an inner surface 219 of button 106. First contact area 220 may be positioned beneath second contact area 224 so that at least one circuit may close when first contact area 220 and second contact area 224 are put in physical contact and/or when movement of contact area 224 closer towards terminal 221 (e.g., underneath contact area 220) causes a change in state that triggers closing the switch. For example, a second circuit board may be positioned such that contact areas of the first circuit board 222 are aligned with contact areas of the second circuit board.

Continuing with the example, second circuit board may be free-standing and/or mounted to one or more surfaces below. Second circuit board may have contact area 224, such as one or more conductive contact pads, that can form an electrical connection when put in contact with the corresponding contact areas 220 of first circuit board 222 (e.g., conductive contact pads 220 of first circuit board 222).

FIG. 3A is a cross sectional view of an alternative embodiment of switch assembly 110, similar to FIG. 2A, with sonic weld joints (denoted as 205) taken across line II-II of FIG. 1A in accordance with some embodiments of the invention. Switch assembly 205 may have a weld plate 202 coupled to an inner housing 201 of a button at one or more sonic weld joints (e.g., as depicted with 206 and 208) to form a seal around switch assembly 205 elements (e.g., circuit boards and contact areas, etc.). At each sonic weld joint, a portion of a bottom surface (e.g., as depicted with 209) of weld plate 202 and a portion of top surface (e.g., as depicted with 211) of inner housing 201 may be welded together at sonic weld joints 206 and 208. Welding at sonic weld joints 206 and 208 may cause the materials to melt at the welding area and form a hermetic seal and/or liquid resistant seal around actuator 200 and switch assembly 205 elements. The seal may protect switch assembly 205 elements from corrosive elements. For example, weld plate 202 and inner housing 201 may at least partially enclose a lip 214 of actuator 200 to ensure that corrosive elements are not able to ingress actuator 200 to reach elements 220 and 224.

Weld plate 202 and inner housing 201 at sonic weld joints 206 and 208 may be created out of plastic, metal, any other material, or combination of materials that allows for sonic welding. Although FIG. 3A illustrates a particular joint design, those with skill in the art will recognize that any other sonic weld joint design or configuration can be used for mating surfaces (e.g., bottom surface 209 of weld plate 202 and upper surface 211 of inner housing 201) for sonic welding. Any number of sonic weld joints 206 and 208 may be positioned around actuator 200 and switch assembly 205 elements.

Sonic weld joints 206 and 208 may be disposed around switch assembly 205 elements to create a seal for the switch. In some embodiments, actuator 200 (e.g., a dome shaped actuator) may be secured in place between welded weld plate 202 and inner housing 201. Actuator 200 may have a three dimensional shape that at least partially encloses switch assembly 205 elements. For example, actuator 200 may be a dome-shaped actuator 200 to enclose a circuit board and/or contact areas 220 and 224. Actuator 200 may be formed from metal, plastic, and/or any other flexible material that allows actuator 200 to deform and resists ingress of corrosive elements. By providing a seal around actuator 200, switch assembly 205 elements may be protected from corrosive elements.

When force is exerted on actuator 200, actuator 200 may deform allowing first contact area 220 and second contact areas 224 of switch assembly 205 to move closer together. Further deformation of actuator 200, in some embodiments, may allow opposing electrical contact areas (e.g., first contact areas 220 and second contact areas 224) within switch assembly 210 to come into physical contact and electrically connect to close a circuit. In addition to or instead of closing a circuit with physical contact between opposing contact areas, force exerted on actuator 200 may allow second contact area 224 and terminal 221 to move closer together to cause a change in state, such as an increase in capacitance, and detection of the change in state may trigger closing a circuit.

A capacitor may be defined between contact area 224 and terminal 221 (e.g., beneath contact area 220). For example, terminal 221 may be positioned on the surface of circuit board 222 or within a stack of layer that create circuit board 222 and contact area 224 may be positioned opposite terminal 221. In some embodiments, terminal 221 can be electrically connected to controller 223 operative to detect and/or measure a change in electrical attributes associated with terminal 221 when button 106 is depressed and/or released, and the detection of which may trigger closing or opening a circuit in response to the detected and/or measured change.

At rest in an original state, electrical contact areas 220 and 224 of switch assembly 205 are separated and the switch is said to be electrically "open." In some embodiments, when actuator 200 is compressed to a point where actuator 200 deforms, opposing electrical contact areas 220 and 224 of the switch may be moved to be in physical and electrical contact to complete an electrical circuit between opposing contact areas 220 and 224, and are said to electrically "close" the switch. The switch may also or instead be triggered by movement of second contact area 224 and terminal 221 (e.g., beneath first contact area 220) closer together to change a state (e.g., capacitance) and detection of the change by the controller 223 may cause the controller 223 to close the circuit. And, when second contact area 224 and terminal 221 (e.g., beneath first contact area 220) move further apart, the controller 223 detects that change in capacitance as well and opens the circuit.

Actuator 200 may compress when contact force is exerted on actuator 200 from above. Force may be applied to button 106 on surface 107 by a user from above in a direction of arrow A causing actuator 200 to deform. For example, a user may apply force on actuator 200 by depressing button 106 within housing 101. FIG. 3B below provides more detail on a deformed actuator 200 that may create an electrical connection between contact areas 220 and 224.

A portion 214 (e.g., a lip) of actuator 200 may fit within gap 212 or a cavity provided between weld plate 202 and inner housing 201 to secure actuator 200 in place. In some embodiments, the portion 214 of actuator 200 may be a lip that fits within gap 212, and actuator 200 may move towards or away from interference element 216 when a user interacts with button 106. The portion 214 of actuator 200 may be a lip and/or an edge of actuator 200 that can fit within gap 212 and is positioned below interference element 216. Interference element 216 provides interference when actuator 200 deforms or moves within gap 212, and interference element 216 may act as an additional seal for switch assembly 205.

In one or more embodiments, as shown in FIG. 3A, interference element 216 may be an O-ring. Interference element 216 may be sized and have a particular shape to provide a substantially guaranteed interference fit for actuator 200.

One or more electrical contact areas (e.g., 220 and 224), such as copper coated conductive pads, may be coupled to a circuit board (e.g., circuit board 222) at fit underneath actuator 200. Circuit boards can have conductive silicon glued to the board and/or have silicon with traces. Circuit boards (e.g., circuit board 222) can extend away from switch assembly 205 and can support and interconnect with any desired amounts of circuitry (e.g., controller 223) for device 100.

For example, a circuit board may fit underneath actuator 200 and have electrical contact area 224, such as one or more conductive pads that are coupled to the circuit board. Contact area 224 may electrically connect when put in contact with another opposing electrical contact area (e.g., contact area 220) and/or when movement of and second contact area 224 towards terminal 221 causes a change in state detected by the controller and the controller closes the switch. In an embodiment, conductive contact pads of contact area 224 are copper coated conductive pads, and contact area 220 is a conductive material either applied to circuit board 222.

FIG. 3B is a cross sectional view of switch assembly 110, similar to FIG. 2B, with sonic weld joints (denoted as 205) taken across line II-II of FIG. 1A in accordance with some embodiments of the invention. FIG. 3B illustrates an actuator 200 of switch assembly 205 in an actuated state. When actuator 200 is in the actuated state, actuator 200 is deformed causing contact areas 220 and 224 to move closer together. Force applied to top surface 107 of button 106 in the direction of arrow A may cause actuator 200 to decompress. Movement of contact area 224 and terminal 221 closer together may cause a change in state (e.g., increase capacitance) and the detected change in state may be detected by controller 223 and the controller 223 may close the switch in some embodiments. Enough force may be applied to top surface 107 of button 106 and, in turn, to actuator 200 resulting in deformation of actuator 200 and allowing contact areas 220 and 224 to be put in sufficient physical contact, and the switch may close.

In an embodiment, pressure may be applied to top surface 107 of button 106 and actuator 200 may move toward inner housing 201 thereby causing lip 214 to compress against interference element 216. Interference element 216 may be designed to handle the application of pressure. For example, interference element 216 may deform and/or absorb some of the pressure when force is applied. When application of pressure ceases, actuator 200, button 106 and interference element 216 may return to original position as depicted in FIG. 3A.

Although particular examples of switch assembly 205 elements are provided, those with skill in the art will recognize that any number of switch designs are available to at least partially enclose switch elements with an actuator and an inner housing 201 and to provide a seal around switch elements and the actuator by securing a portion of the actuator between a welded weld plate 204 and inner housing 201. For example, switch assembly 205 may have a second circuit board mounted to inner surface 217 of actuator 200 having a second contact area 224 positioned over a first contact area 220 coupled to first circuit board 222 mounted to an inner surface 219 of inner housing 201. First contact area 220 may be positioned below second contact area 224 so that at least one circuit may close when first contact area 220 and second contact area 224 are put in physical contact. For example, a second circuit board may be positioned such that contact areas of the first circuit board 222 are aligned with contact areas of the second circuit board.

Continuing with the example, first circuit board may be free-standing and/or mounted to one or more surfaces below. First circuit board 222 may have contact area 220, such as one or more conductive contact pads, that can form an electrical connection when put in contact with the corresponding contact areas 224 of second circuit board.

Figure 4:
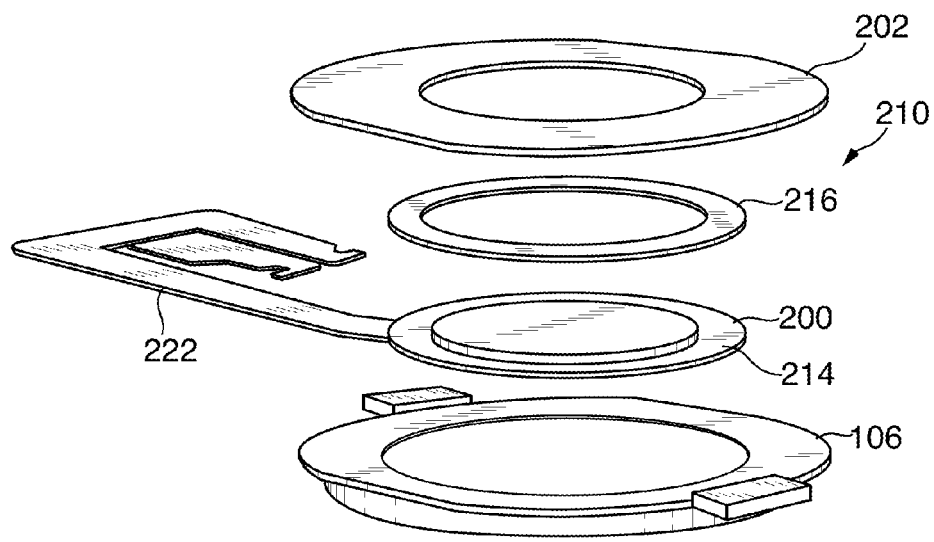
FIG. 4 is a bottom perspective view of elements of switch assembly 110 with sonic weld joints (denoted as 210) in accordance with some embodiments of the invention.

FIG. 4 is a bottom perspective view of elements of switch assembly with sonic weld joints (denoted as 210) in accordance with some embodiments of the invention. Weld plate 202 may have disc shape sized to fit over interference element 216 and around dome actuator 200. Weld plate 202 may be welded to button 106 at sonic weld joints to create a seal around actuator 200. Portion 214 of actuator 200 may fit between weld plate 202 and button 106. Interference element 216 may fit between weld plate 202 and actuator 200. In some embodiments, when actuator 200 is actuated, contact areas within actuator 200 may move physically closer to change a state and/or come in to physical contact to allow for the contact areas to electrically connect and close at least one circuit on circuit board 222.

Figure 5:
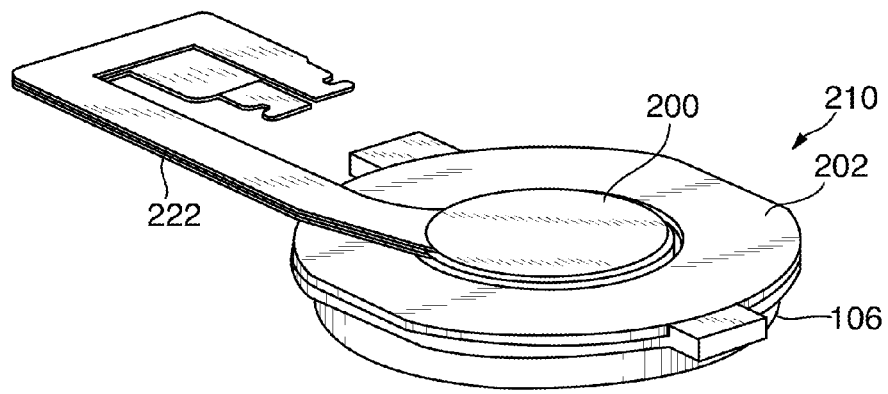
FIG. 5 is a bottom perspective view of switch assembly with sonic weld joints (denoted as 210) in accordance with some embodiments of the invention.

FIG. 5 is a bottom perspective view of switch assembly with sonic weld joints (denoted as 210) in accordance with some embodiments of the invention. Switch assembly 210 is shown with weld plate 202 welded at sonic weld joints to button 106, and sonic weld joints are disposed around actuator 200 to provide a hermetic seal. A portion of dome-shaped actuator 200 is exposed and may be actuated with an application of force on button 106 to close at least one circuit on circuit board 222.

Figure 6:
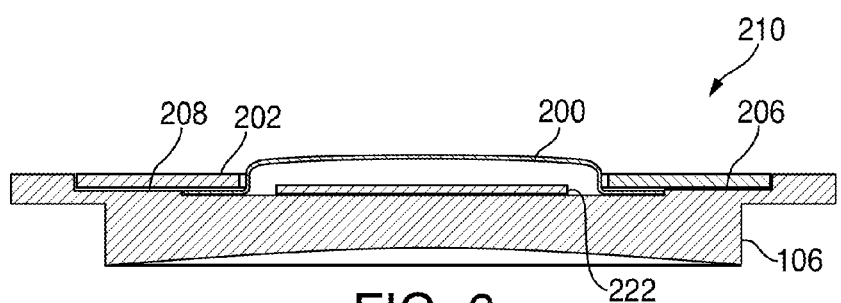
FIG. 6 is a bottom cross sectional view of switch assembly 110 with sonic weld joints (denoted as 210) taken across line VI-VI of FIG. 1A in accordance with some embodiments of the invention.

FIG. 6 is a bottom cross sectional view of switch assembly 110 with sonic weld joints (denoted as 210) taken across line VI-VI of FIG. 1A in accordance with some embodiments of the invention. Weld plate 202 is welded to button 106 at sonic weld joints 206 and 208 to protect switch elements of switch assembly 210 from corrosive elements.

Figure 7:
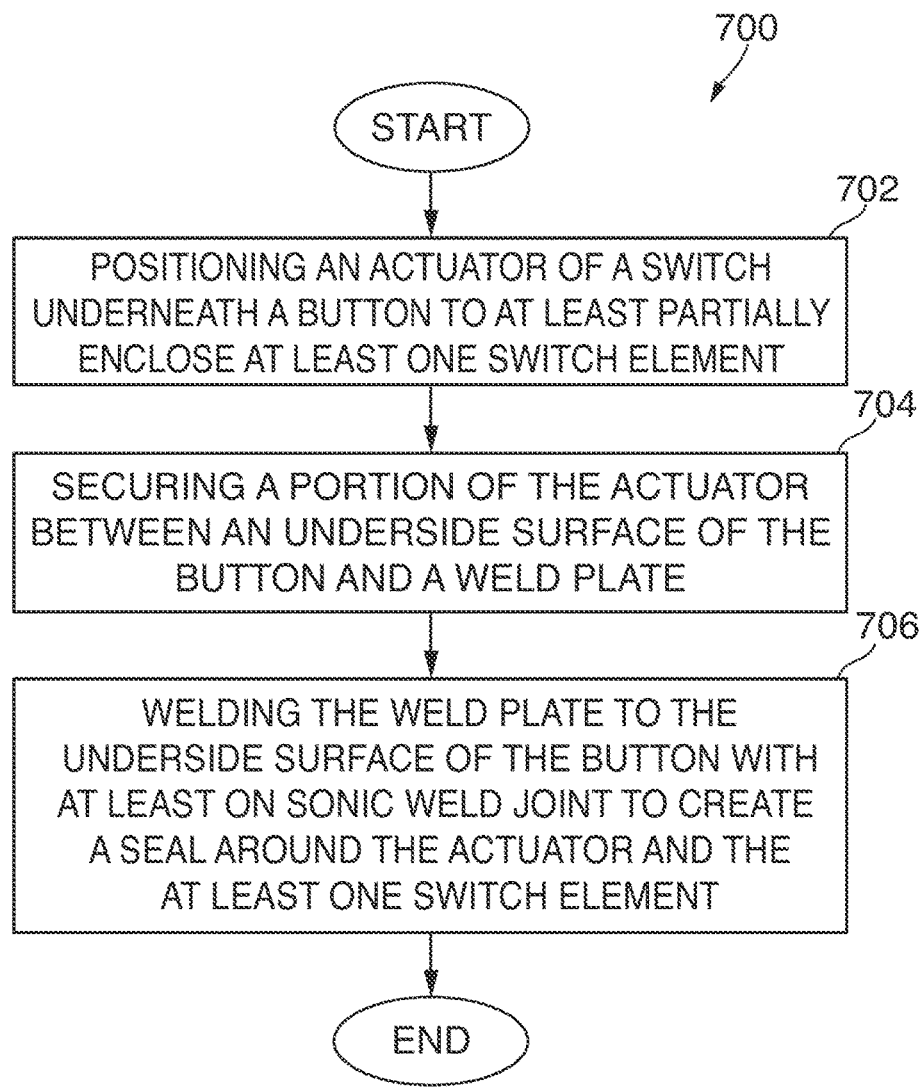
FIG. 7 is a flowchart illustrating a method in accordance with some embodiments of the invention.

FIG. 7 is a flowchart illustrating a method in accordance with some embodiments of the invention. Flowchart 700 illustrates a method for creating a seal around switch elements. An actuator 200 of a switch may be positioned underneath a button 106 to at least partially enclose at least one switch element (702). A portion 214 of the actuator 200 may be secured between an underside surface of the button and a weld plate 202 (704). The portion of the actuator 200 may be a lip 214 that fits between the button 106 and the weld plate 202. A contact area may be coupled to a first circuit board for the switch and mounted to a surface of the actuator 200. The weld plate 202 may be welded to the underside surface of the button 106 with at least one sonic weld joint 206 and 208 to create a seal around the actuator 200 and the at least one switch element (706). The sonic weld joints 206 and 208 may be disposed around the actuator 200 to ensure that the switch elements are protected from corrosive elements.

FIG. 8 is a cross sectional view of switch assembly 110 using conductive covering (denoted as 310) taken across line II-II of FIG. 1A in accordance with some embodiments of the invention. Conductive covering 300 encloses elements of switch assembly 310 to ensure protection from liquids and/or other corrosive elements. Conductive covering 300 may be created from conductive silicon or any other conductive material that protects switch assembly 310 elements.

Conductive covering 300 may be shaped to house one or more circuit boards (e.g., circuit board 302) for switch assembly 310. In an embodiment, conductive covering 300 may be shaped like a boot to enclose a similarly shaped circuit board 302. Conductive covering 300 may have any three dimensional shape that allows for enclosing switch assembly 310 elements and provides room for movement of inner surface 314 of conductive covering 300 toward switch elements. In particular, three dimensional shaped conductive covering 300 may have a shape that allows for switch to be open at rest, and conductive covering 300 may provide enough room for inner surface 314 to move closer to contact area 312 and close the switch when sufficient force is applied at top surface 316 of conductive covering 300. As shown in FIG. 8, the conductive covering 300 may be positioned along a support layer 321.

In some embodiments, conductive covering 300 may be compressed to come into physical and electrical contact with contact areas (e.g., contact area 312) on circuit boards (e.g., circuit board 302) housed within. In an embodiment, actuator 306 is a metal dome that may be positioned over conductive covering 300. When force is applied to top surface 107 of button 106 in the direction of arrow A, actuator 306 may deform and come into contact with conductive covering 300. Force exerted on conductive covering 300 may allow conductive covering 300 to move closer to contact area 312 of at least one circuit board 302 within switch assembly 310 to close the switch.

In addition or instead of closing a switch with physical contact between conductive covering 300 and contact areas, compression of actuator 306 and/or conductive covering 300 may change a state (e.g., capacitance) that may be detected by controller 305 and controller 305 may cause completion of a circuit. A capacitor may be defined between conductive covering 300 and terminal 303 on circuit board 302. For example, terminal 303 may be positioned on the surface of circuit board 302 or within a stack of layer that create circuit board 302 and conductive covering 300 may be positioned opposite terminal 303. In some embodiments, terminal 303 can be electrically connected to controller 305 operative to detect and/or measure a change in electrical attributes associated with terminal 303 when button 106 is depressed and/or released, and the detection of which may trigger closing or opening a circuit in response to the detected and/or measured change. For example, conductive covering 300 and terminal 303 on circuit board 302 may be conductors of a capacitor, and movement of conductive covering 300 may increase the capacitance that may be detected by controller 305 and cause the controller to close a circuit.

In an embodiment, switch assembly 310 may have a switch with contact areas (e.g., conductive contact pad 312) that surround a circuit board 302 (e.g., located above and below the circuit board) or are coupled to one side of a circuit board 302 (e.g., contact areas 312 above the circuit board 302). A contact area of switch assembly 310 may be coupled to bottom inner surface 318 of conductive covering 300. When force exerted on conductive covering 300 brings conductive covering 300 in contact with contact area 312, at least one circuit for switch 310 may be closed. The switch 310 may also or instead be triggered by movement of conductive covering 300 and terminal 303 closer together to change state (e.g., capacitance) and detection of the change by the controller 305 may cause completion of the circuit. And, when conductive covering 300 and terminal 303 move further apart, the controller 305 detects the change in capacitance as well and opens the circuit.

As depicted, in some embodiments, conductive covering 300 may be tucked up into button 106. For example, conductive covering 300 may fit within a cavity or hollow section of button 106.

FIG. 9 is a cross sectional view of switch assembly 110 using conductive covering (denoted as 310) taken across line II-II of FIG. 1A in accordance with some embodiments of the invention. When force is exerted on top surface 107 of button 106 in direction of arrow A, actuator 306 may deform as illustrated in FIG. 9. In some embodiments, application or removal of force on button 106, actuator 306, and/or conductive covering 300 may cause a change of state (e.g., capacitance) and detection of the change in state by controller 305 may cause the controller 305 to close or open the switch. If sufficient force is applied to actuator 306, then conductive covering 300 located beneath actuator 306 may, in turn, deform to allow inner surface 314 of conductive covering 300 to physically come into contact with contact area 312 of switch and close the switch in some embodiments. As shown in FIG. 9, the conductive covering 300 may be positioned along a support layer 321.

When application of pressure ceases, actuator 306 and conductive covering 300 may return to original position as depicted in FIG. 8.

Figure 10:
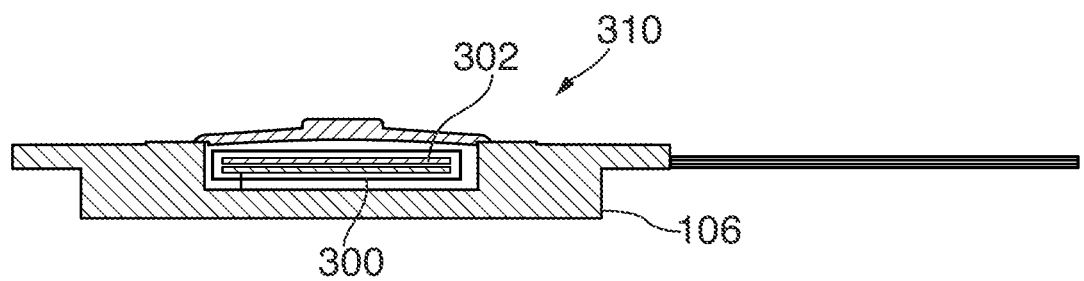
FIG. 10 is a cross sectional view of switch assembly 110 using conductive covering (denoted as 310) taken across line VI-VI of FIG. 1A in accordance with some embodiments of the invention.

FIG. 10 is a bottom cross sectional view of switch assembly 110 using conductive covering (denoted as 310) taken across line VI-VI of FIG. 1A in accordance with some embodiments of the invention. Conductive covering 300 may completely enclose switch elements of switch assembly 310. Conductive covering 300 may be created from flexible conductive silicon that can bend enough to allow for easy removal of tools used to put conductive covering 300 in places within the device 100. In another embodiment, conductive covering 300 may partially cover switch elements. For example, conductive covering 300 may provide a covering for only switch elements at risk to exposure to corrosive elements, such as conductive contact areas, and other portions of a flexible circuit may remain exposed. The conductive covering 300 may be formed from any material that protects switch assembly 310 elements from corrosive elements.

Figure 11:
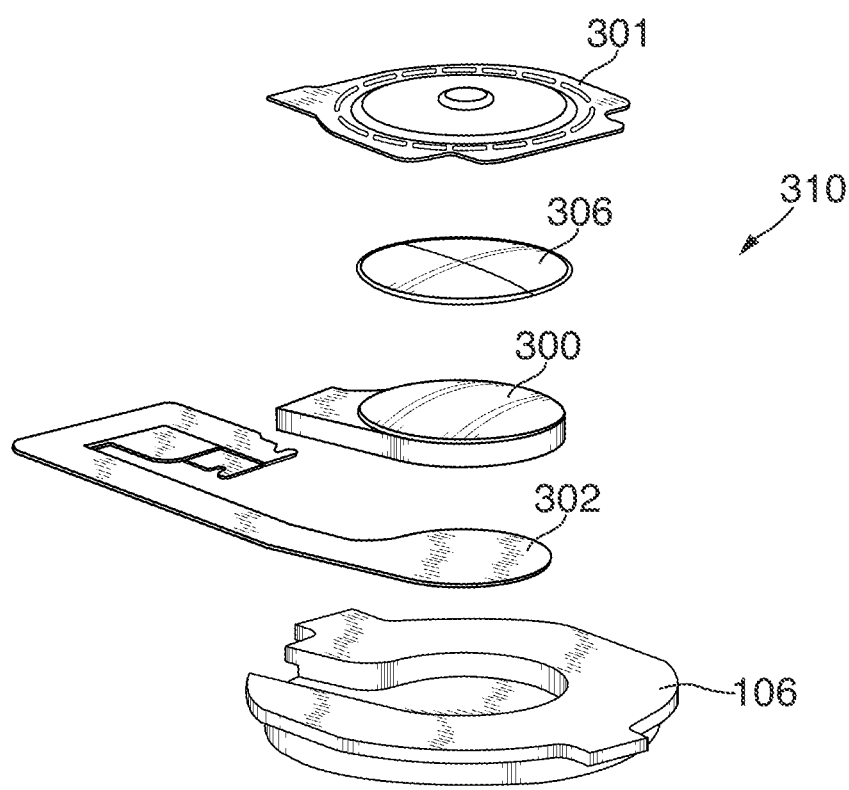
FIG. 11 is a cross sectional view of switch assembly 110 using conductive covering (denoted as 310) taken across line VI-VI of FIG. 1A in accordance with some embodiments of the invention.

FIG. 11 is a bottom perspective view of switch assembly with conductive covering (denoted as 310) in accordance with some embodiments of the invention. Conductive covering 300 fits over circuit board 302 to enclose and protect switch from corrosive elements. Conductive covering 300 may fit within button 106 and actuator 306 may be coupled to button 106 or conductive covering 300 so as to fit over conductive covering 300. Dome sheet 301 may fit over actuator 306 (e.g., metal dome) to fix actuator 306 in place. Dome sheet 301 may be formed from plastic, rubber or any other flexible material. Adhesive may be applied to button 106 or actuator 306 to secure dome sheet 301 over actuator 306 and keep conductive covering 300 in place.

Figure 12:
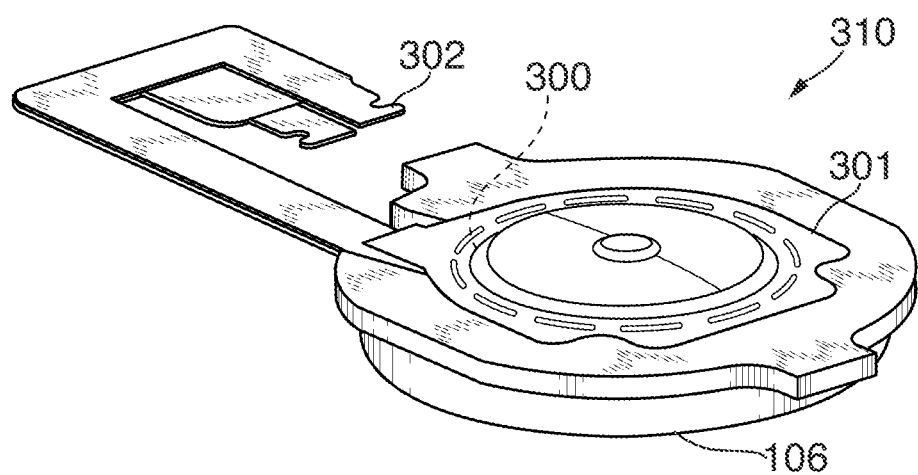
FIG. 12 is a bottom perspective view of switch assembly with conductive covering (denoted as 310) in accordance with some embodiments of the invention.

FIG. 12 is a bottom perspective view of switch assembly with conductive covering (denoted as 310) in accordance with some embodiments of the invention. Circuit board 302 fits within conductive covering 300 that sits within a cavity of button 106. Dome sheet 301 is shown coupled to button 106 to secure actuator 306 over conductive covering 300.

Figure 13:
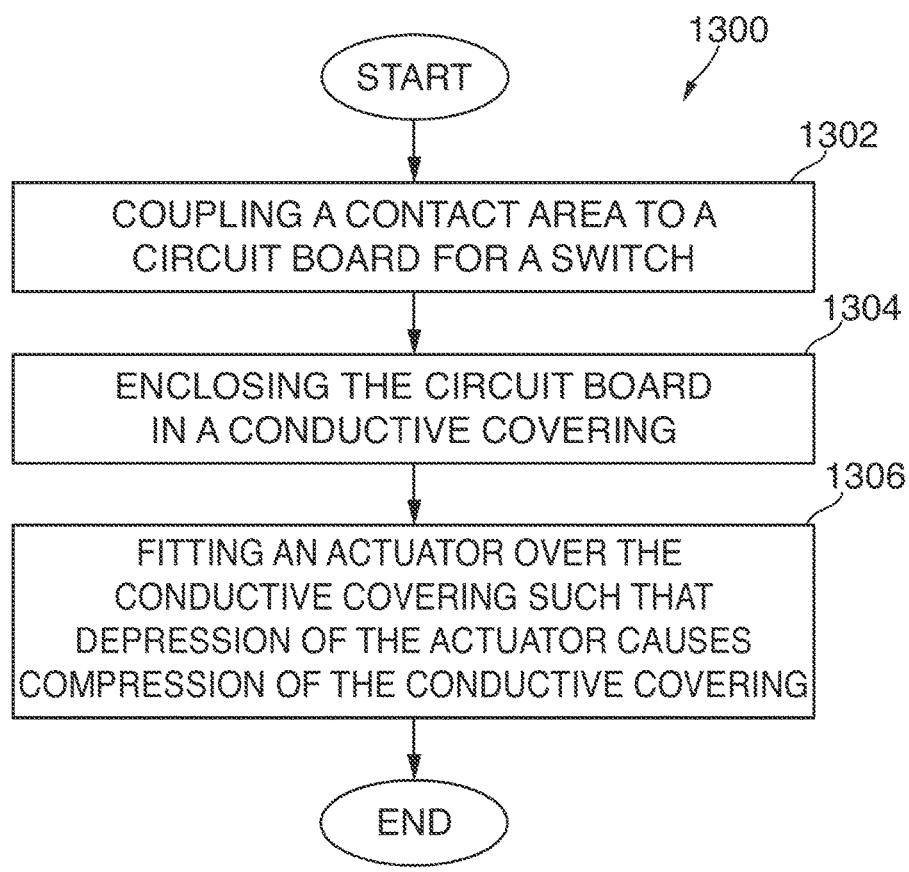
FIG. 13 is a flowchart illustrating a method in accordance with some embodiments of the invention.

FIG. 13 is a flowchart illustrating a method in accordance with some embodiments of the invention. Flowchart 1300 illustrates a method for enclosing a switch in a conductive covering for a device. A contact area may be coupled to a circuit board for a switch (1302). The circuit board may be enclosed in a conductive covering (1304). In some embodiments, the conductive covering is made from a flexible material that can easily bend to allow for placement within device 100. An actuator may fit over the conductive covering such that depression of the actuator causes compression of the conductive covering (1306). The actuator may be a metal dome that is secured over conductive covering with the use of a dome sheet.

Figure 14:
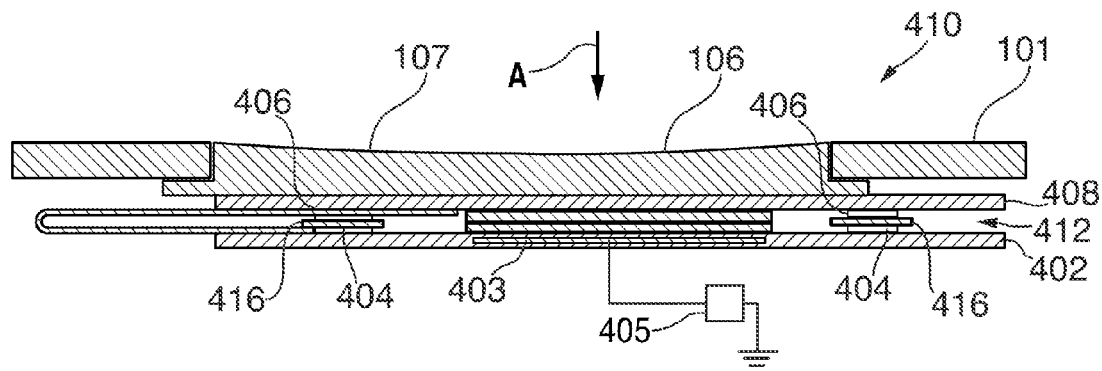
FIG. 14 is a cross sectional view of switch assembly using conductive adhesive (denoted as 410) taken across line II-II of FIG. 1A in accordance with some embodiments of the invention.

FIG. 14 is a cross sectional view of switch assembly using conductive adhesive (denoted as 410) taken across line II-II of FIG. 1A in accordance with some embodiments of the invention. Button 106 may be fitted within housing to sit over second circuit board 408. In an embodiment, button 106 may serve as an actuator for switch assembly 410. When pressure is applied to button 106 in the direction of arrow A, button 106 may compress second circuit board 408 to move closer to first circuit board 402 to close the switch 412.

Switch assembly 410 may have electrical contact areas 404 and 406, such as conductive contact pads 404 coupled to first circuit board 402 and conductive contact pads 406 coupled to second circuit board 408. In an embodiment, conductive contact pads 404 and 406 may be at least partially ring-shaped. Although conductive contact pads are depicted as ring-shaped, those with skill in the art will recognize that other shapes for contact pads may be used to create a seal around switch elements.

A layer of conductive adhesive 416 may be applied to at least a portion of conductive contact pad 404 and a portion of conductive contact pad 406 of second circuit board 408. For example, if conductive contact pads 404 and 406 are partially ring-shaped, a ring-shaped layer of conductive adhesive 416 may sit between conductive contact pad 404 and conductive contact pad 406. Layers of conductive adhesive 416 may form a water resistant seal for the switch elements of switch assembly 410. Although application of conductive adhesive is described as being applied to take the shape of the conductive pad (e.g., a ring-shaped conductive pad), those with skill in the art will recognize that a conductive adhesive may be applied to take any shape and/or in any manner to form a seal.

Figure 15:
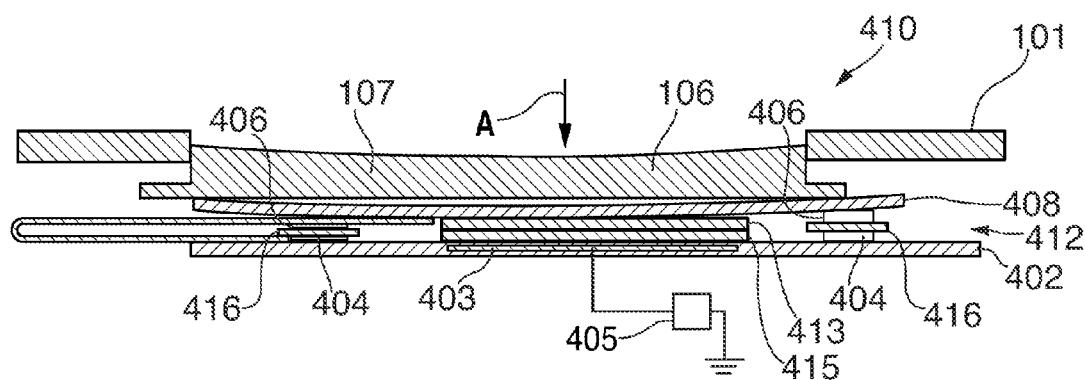
FIG. 15 is a cross sectional view of switch assembly using conductive adhesive (denoted as 410) taken across line II-II of FIG. 1A in accordance with some embodiments of the invention.

FIG. 15 is a cross sectional view of switch assembly using conductive adhesive (denoted as 410) taken across line II-II of FIG. 1A in accordance with some embodiments of the invention. Force may be exerted on switch 412 at top surface 107 in direction of arrow A to compress button 106. The compression of button 106 may compress the second circuit board 408 positioned under the button 106. When second circuit board 408 is compressed into first circuit board 402, contact areas 406 and 404 may come into physical contact and electrically connect and complete at least one circuit of switch 412.

In addition to or instead of completing a circuit by physical contact, opposing contact areas (e.g., 406 and 408) and/or other opposing switch 412 elements may serve as conductors of a capacitor and contact with button 106, movement of button 106, and/or circuit board 408 may change a state (e.g., increase capacitance). In particular, a capacitor may be defined between contact area 413 and terminal 403 (e.g., beneath contact area 415).

For example, terminal 403 may be positioned on the surface of circuit board 402 or within a stack of layers that create circuit board 402 and contact area 413 may be positioned opposite terminal 403. In some embodiments, terminal 403 can be electrically connected to controller 405 and controller 405 may be operative to detect and/or measure a change in electrical attributes associated with terminal 403 when button 106 is depressed to close a circuit and/or released to open a circuit, and the detection of which may trigger closing or opening a circuit in response to the detected and/or measured change. Controller 405 may detect the change in state and cause the completion of at least one circuit of switch 412 and/or open a circuit of switch 412.

In some embodiments, second and first circuit boards 408 and 402 may have inner conductive contact pads 413 and 415, respectively. When second circuit board 408 is compressed into first circuit board 402, inner conductive pads 413 and 415 may be put into physical contact so as to electrically connect and close at least one circuit of switch 412. As shown, inner conductive pads 413 and 415 are not coupled together with a conductive adhesive, and as a result, relatively more force may be applied to the actuator to cause inner conductive pads 413 and 415 to come in to physical contact and close a circuit than an amount of force applied to cause contact pads 404 and 406 to close a circuit.

When application of pressure ceases, button 106 and circuit board 408 may return to original position as depicted in FIG. 14.

Figure 16:
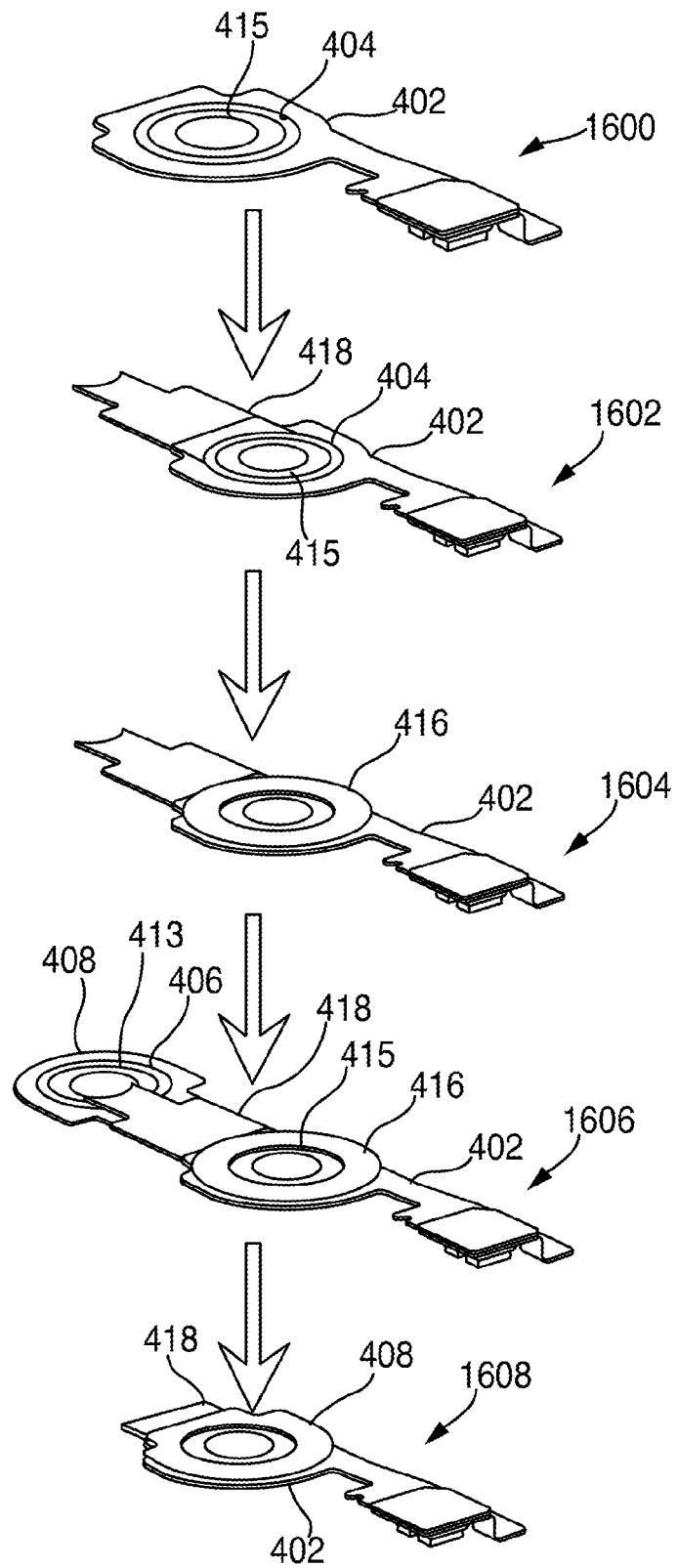
FIG. 16 is a bottom perspective view of an assembly process for a switch assembly using conductive adhesive.

FIG. 16 is a bottom perspective view of an assembly process for a switch assembly using conductive adhesive. At step 1600, first circuit board 402 may have contact areas coupled to the first circuit board 402, such as ring-shaped outer contact pad 404 and a circular inner contact pad 415. Sheet 418 may be secured to first circuit board 402, such as sheet 418 may be soldered to first circuit board 402 (1602). Sheet 418 may be created from metal (e.g., copper) or any other flexible material. Conductive adhesive may be applied over outer contact pad 404 and sheet 418 (1604). For example, conductive adhesive may be applied to have a thickness of 0.1 mm over contact pad 404 and the area of sheet soldered to first circuit board 402. Sheet 418 may be coupled (e.g., soldered) to inner contact pad 413 of second circuit board 408 (1606). Sheet 418 may be folded over and second circuit board 408 may be pressed into first circuit board 402 (1608).

Figure 17:
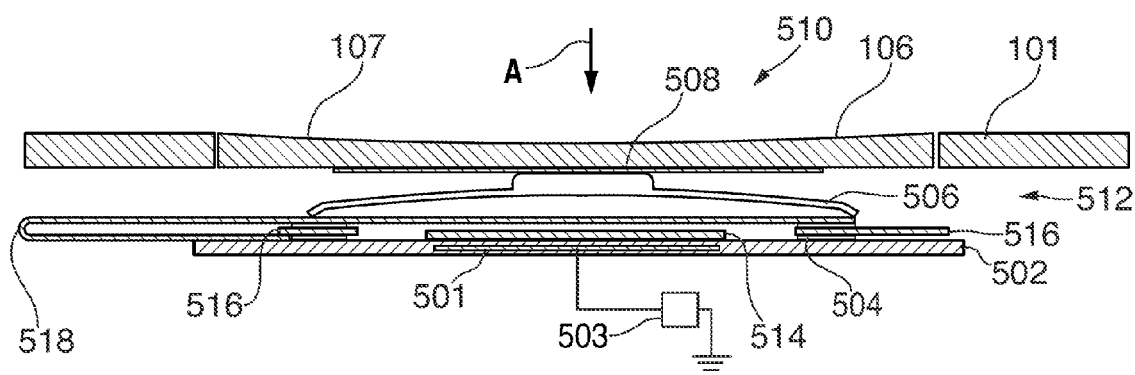
FIG. 17 is a cross sectional view of switch assembly using conductive adhesive (denoted as 510) taken across line II-II of FIG. 1A in accordance with some embodiments of the invention.

FIG. 17 is a cross sectional view of switch assembly using conductive adhesive (denoted as 510) taken across line II-II of FIG. 1A in accordance with some embodiments of the invention. First circuit board 502 may have an outer contact pad 504 and inner contact pad 514. Contact sheet 518 may be coupled to first circuit board 502 and folded over first circuit board 502. Actuator 506 (e.g., dome) may be fitted over contact sheet 518 and secured in place with dome sheet 508. A conductive adhesive 516 may be applied between first circuit board 502 and contact sheet 518, and conductive adhesive 516 may provide a seal to protect switch assembly 510 elements against corrosive elements.

Figure 18:
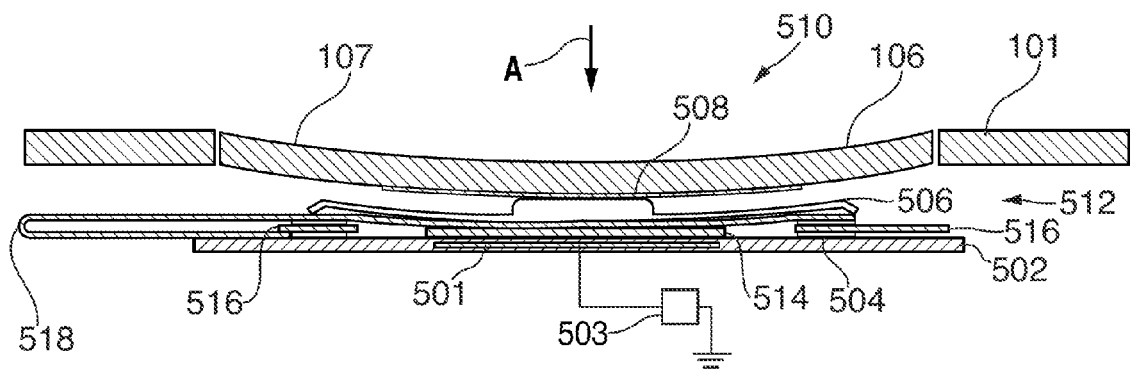
FIG. 18 is a cross sectional view of switch assembly using conductive adhesive (denoted as 510) taken across line II-II of FIG. 1A in accordance with some embodiments of the invention.

FIG. 18 is a cross sectional view of switch assembly using conductive adhesive (denoted as 510) taken across line II-II of FIG. 1A in accordance with some embodiments of the invention. Force may be exerted on switch 512 at top surface 107 in direction of arrow A to compress button 106. The compression of button 106 may cause compression of actuator 506 and contact sheet 518 positioned under the button 106. When contact sheet 518 is compressed into first circuit board 502, contact areas 514 and 504 may come into physical contact with contact sheet 518 and electrically connect and complete at least one circuit of switch 512.

In addition to or instead of completing a circuit by physical contact, opposing contact areas (e.g., 518 and 504) and/or other opposing switch 512 elements may serve as conductors of a capacitor and contact with button 106, movement of button 106, and/or circuit board 502 may change a state (e.g., increase capacitance). In particular, a capacitor may be defined between contact sheet 508 and terminal 501 (e.g., beneath contact area 514). For example, terminal 501 may be positioned on the surface of circuit board 502 or within a stack of layers that create circuit board 502 and contact sheet 508 may be positioned opposite terminal 501. In some embodiments, terminal 501 can be electrically connected to controller 503 and controller 503 may be operative to detect and/or measure a change in electrical attributes associated with terminal 501 when button 106 is depressed to close a circuit or open a circuit when button 106 is released. Controller 503 may detect the change in state and cause the completion of at least one circuit of switch 512 and/or open a circuit of switch 512.

In some embodiments, first circuit board 502 may have inner conductive contact pads 514. When contact sheet 518 is compressed into first circuit board 502, inner conductive pads 514 may be put into physical contact with contact sheet 518 so as to electrically connect and/or moved closer together to change a state and close at least one circuit of switch 512. As shown, inner conductive pad 514 and contact sheet 518 are not coupled together with a conductive adhesive, and as a result, relatively more force may be applied to actuator 506 to cause inner conductive pad 514 to come in to physical contact with contact sheet 518 and closed a circuit than an amount of force applied to cause contact pad 504 and contact sheet 518 to close a circuit.

When application of pressure ceases, button 106 and circuit board 408 may return to original position as depicted in FIG. 14.

Figure 19:
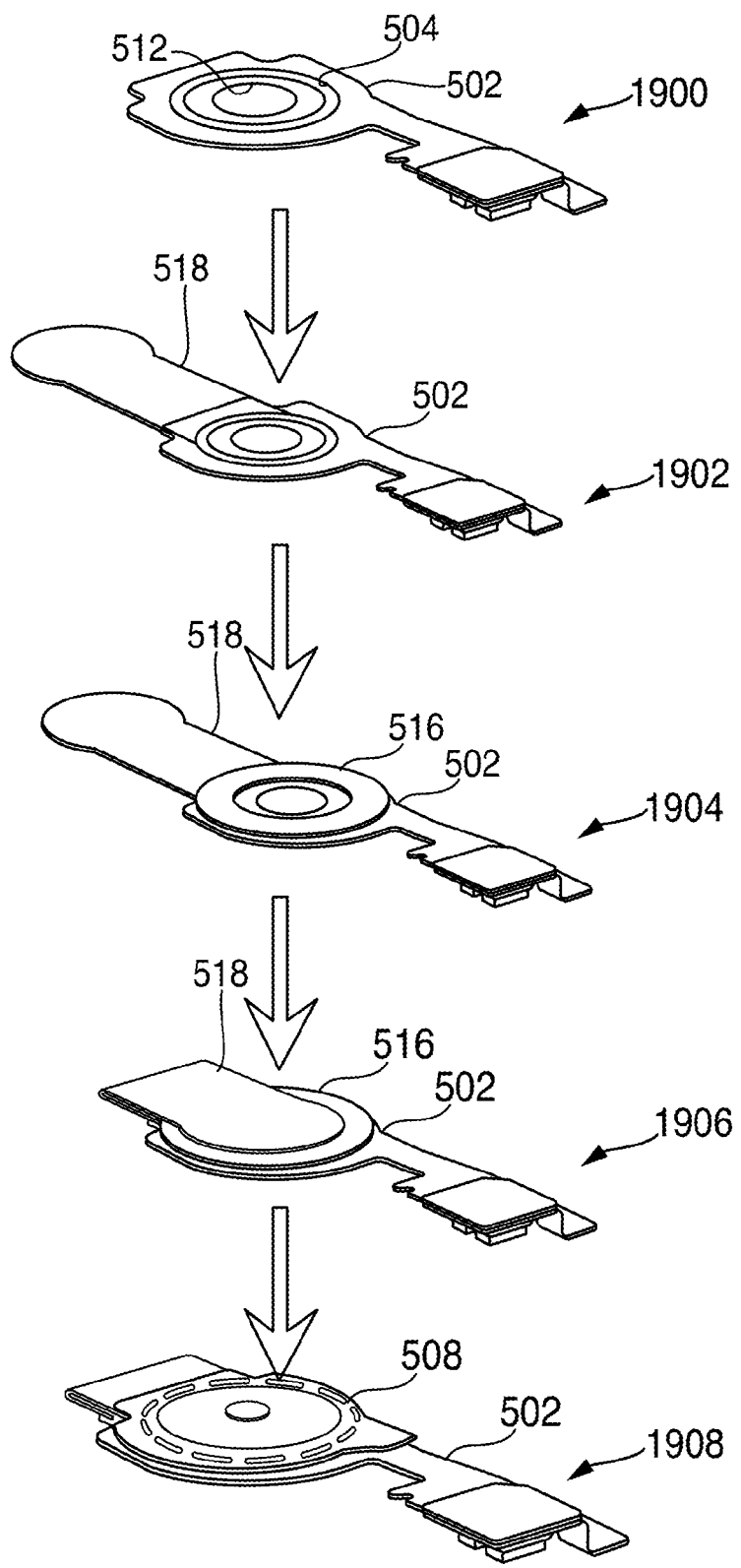
FIG. 19 is a bottom perspective view of an assembly process for a switch assembly using conductive adhesive.

FIG. 19 is a bottom perspective view of an assembly process for a switch assembly using conductive adhesive. At step 1900, first circuit board 502 may have contact areas coupled to the first circuit board 502, such as ring-shaped outer contact pad 504 and a circular inner contact pad 514. Contact sheet 518 may be secured to first circuit board 502; such as contact sheet 518 may be soldered to first circuit board 502 (1902). Contact sheet 518 may be created from a conductive metal (e.g., copper) or any other flexible, conductive material. Conductive adhesive 516 may be applied over outer contact pad 504 and contact sheet 518 (1904). For example, conductive adhesive may be applied to have a thickness of 0.1 mm over contact pad 504 and the area of contact sheet 518 soldered to first circuit board 502. Contact sheet 518 may be folded over and pressed into first circuit board 502 (1906). Actuator 506 and dome sheet 508 may be secured over contact sheet 518 (1908).

Figure 20:
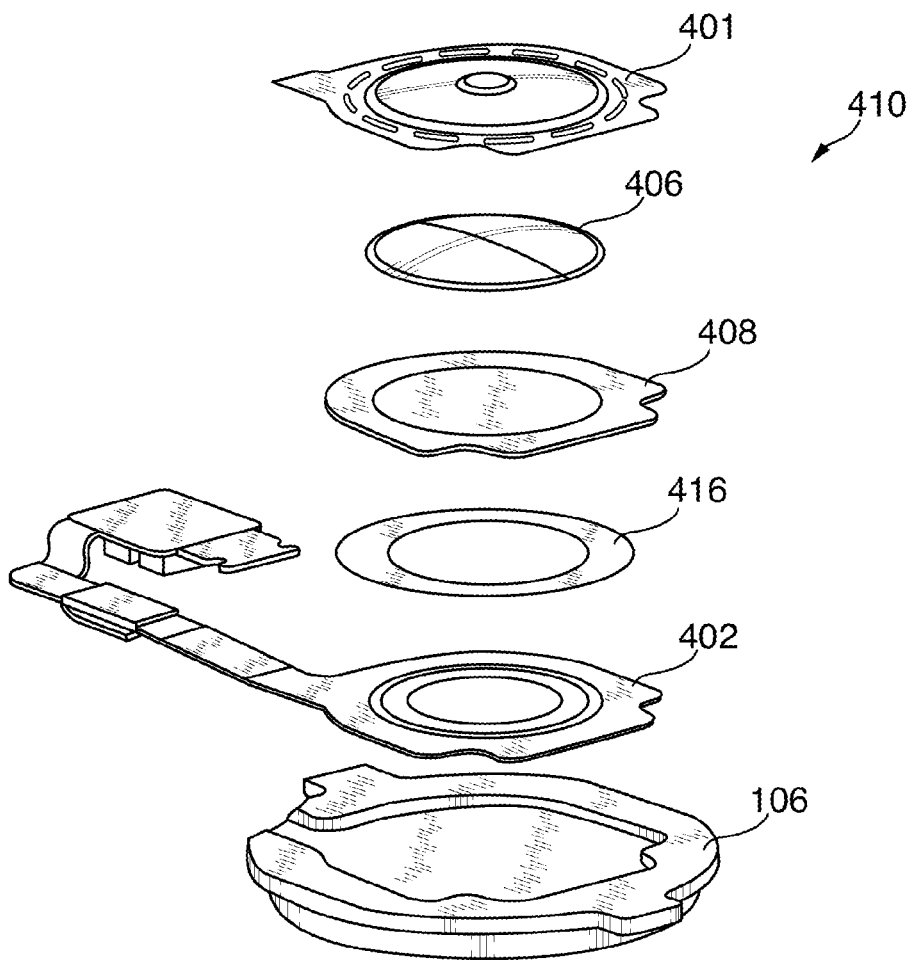
FIG. 20 is a bottom perspective view of switch assembly with conductive adhesive (denoted as 410) in accordance with some embodiments of the invention.

FIG. 20 is a bottom perspective view of switch assembly with conductive adhesive (denoted as 410) in accordance with some embodiments of the invention. First circuit board 402 fits within button 106. Conductive adhesive 416 is applied over first circuit board 402 to form a seal to protect switch assembly 410 elements from corrosive elements. Second circuit board 408 may be pressed into conductive adhesive 416. Dome sheet 401 may fit over second circuit board 408 to secure switch elements in place. Dome sheet 401 may be formed from plastic, rubber or any other flexible material. Adhesive may be applied to button 106 to secure dome sheet 401 over switch elements to keep switch elements in place.

Figure 21:
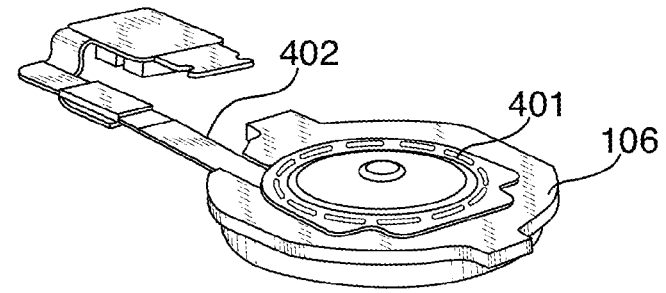
FIG. 21 is a bottom perspective view of switch assembly with conductive adhesive (denoted as 410) in accordance with some embodiments of the invention.

FIG. 21 is a bottom perspective view of switch assembly with conductive adhesive (denoted as 410) in accordance with some embodiments of the invention. First circuit board 402 fits within button 106. Dome sheet 401 is shown coupled to button 106 to fix switch elements in place, and conductive adhesive 416 is applied between second circuit board 408 and first circuit board 402 to form a seal to protect switch 412 elements.

Figure 22:
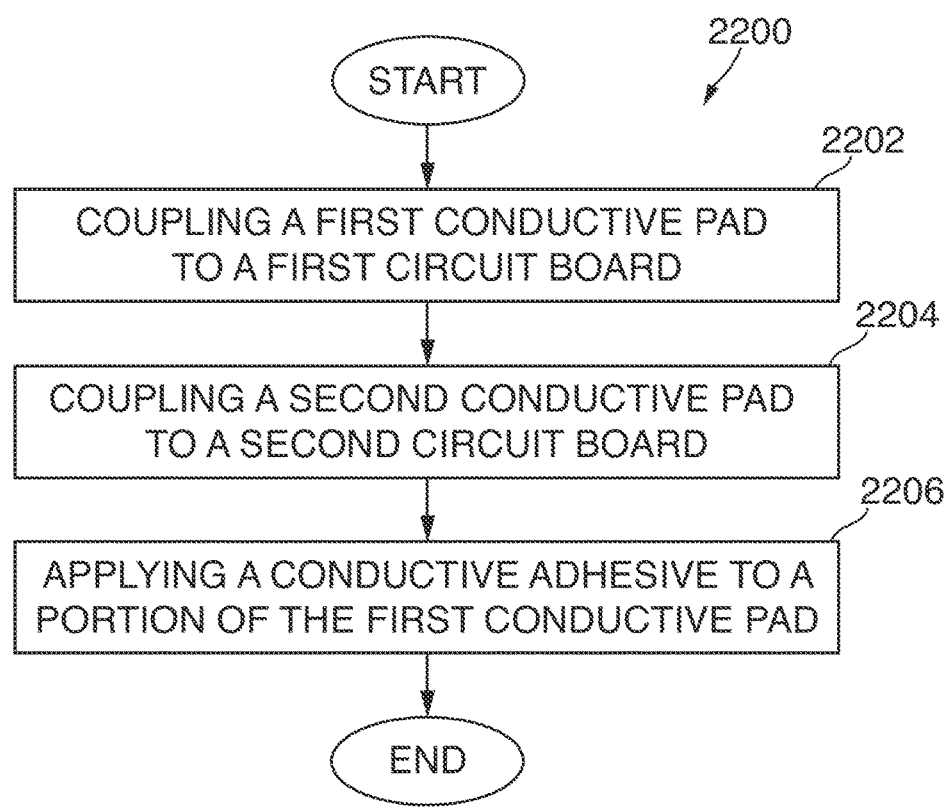
FIG. 22 is a flowchart illustrating a method in accordance with some embodiments of the invention.

FIG. 22 is a flowchart illustrating a method in accordance with some embodiments of the invention. A first conductive contact pad is coupled to a first board (2202). A second conductive contact pad is coupled to a second board (2204). A layer is applied of conductive adhesive to at least a portion of the first conductive pad (2206). The layer is situated between the first conductive pad and the second conductive pad, and the conductive adhesive provides a seal for a switch.

In certain embodiments, electronic device 100 can also include at least one user input component that may be of a variety of forms other than that of a switch assembly. For example, device 100 can also include one or more input components that may take other various forms, including, but not limited to: switches, sliding switches, keypads, dials, scroll wheels, touch screen displays, electronics for accepting audio and/or visual information, antennas, infrared ports, or combinations thereof.

According to certain embodiments, the position of one or more of input components can be widely varied relative to the position of another one or more of input components. For example, they can be adjacent to one another or spaced apart. Additionally, each one of the one or more input components can be placed at any external surface (e.g., top, bottom, side, front, back, or edge) of housing 101 that may be accessible to a user during manipulation of the electronic device 100.

In certain embodiments, each of the one or more input components of device 100 can be configured to provide one or more dedicated control functions for making selections or issuing commands associated with operating device 100. By way of example, in the case of a media player, an input component can be associated with powering up or down the device, opening or closing a menu, playing or stopping a song, changing a mode, and/or the like.

As mentioned above, certain embodiments of device 100 can include at least one output component that provides the user with information, sound, and/or a display of information. Output components can take various forms including, but not limited to, audio speakers, headphones, audio line-outs, visual display, antennas, infrared ports, ports, or any combination thereof.

In certain embodiments, one or more of the switch assemblies described can be integrated with another input component, including but not limited to, the following: switches, push-button, keys, dials, trackball, joysticks, touch pads, touch screens, scroll wheels, displays, microphones, speakers, cameras, and/or the like.

Although not shown, device 100 may have many other elements in addition to input and output components, including, but not limited to: a processor, a storage device, communications circuitry, a bus and/or a power supply. The bus can provide a data transfer path for transferring data to/from elements of device 100. The processor can control functions of the device and other circuitry. For example, processor can receive user inputs from switch assembly 110 and drive output component 104.

Storage device can include one or more storage mediums, including, for example, a hard drive, a permanent memory, such as ROM, a semi-permanent memory, such as RAM, and/or a cache that can store data. Data can include, but is not limited to, the following: media, software, configuration information, and/or any other type of data.

Communications circuitry can include circuitry for wireless communication (e.g. short and long range communication). For example, the wireless communication circuitry of device 100 can be Wi-Fi enabling circuitry that permits wireless communication according to one of the 802.11 standards. Other standards can be supported, such as Bluetooth®. Communication circuitry can include circuitry that enables device 100 to be coupled to another device and communication with that other device. Additional electrical components can be provided for sending and receiving media, including, but not limited to, microphones, amplifiers, digital signal processors, image sensors, optics, antennas, receivers, transmitters, transceivers, and the like.

While there have been described switches and methods for the producing switches thereof, it is to be understood that many changes may be made therein without departing from the spirit and scope of the invention. Insubstantial changes from the claimed subject matter as viewed by a person with ordinary skill in the art, no known or later devised, are expressly contemplated as being equivalently within the scope of the claims. Therefore, obvious substitutions now or later known to one with ordinary skill in the art are defined to be within the scope of the defined elements. The described embodiments of the invention are presented for the purpose of illustration and not of limitation.

What is claimed is:

1. An input component assembly, comprising:
a button defining an input surface;
a first circuit board;
a first inner conductive contact pad coupled to the first circuit board and defining a first switch element;
a first outer conductive contact pad coupled to the first circuit board and encircling the first switch element;
a second circuit board positioned between the button and the first circuit board;
a second inner conductive contact pad coupled to the second circuit board and defining a second switch element;
a second outer conductive contact pad coupled to a second board and encircling the second switch element;
a sheet member, comprising:
 a first end extending from the first circuit board;
 a second end extending from the second circuit board; and
 a folded portion connecting the first and second ends; and
a layer of conductive adhesive between the first outer conductive pad and the second outer conductive pad, wherein:
the layer of conductive adhesive encloses the first and second switch elements; and
the first switch element and the second switch element are configured to contact one another in response to a depression of the button, thereby triggering a switch event.

2. The input component assembly of claim 1, wherein:
the first and the second outer conductive contact pads are at least partially ring shaped and the layer is a ring of conductive adhesive between the first and the second outer conductive contact pads; and
the first and the second switch elements are disposed within a volume defined by the ring of conductive adhesive.

3. The input component assembly of claim 1, wherein the first and the second outer conductive contact pads are copper coated.

4. The input component assembly of claim 1, wherein the layer of conductive adhesive prevents corrosive elements from coming in to contact with the switch.

5. The input component assembly of claim 1, wherein the layer of conductive adhesive forms a water resistant seal around the first and second switch elements.

6. The input component assembly of claim 1, wherein the layer of conductive adhesive comprises conductive silicon glued to the first circuit board.

7. A method of forming a switch assembly, comprising:
coupling a first outer conductive contact pad to a first circuit board to encircle a first inner conductive contact pad, the first inner conductive contact pad coupled to the first circuit board and defining a first switch element of the first circuit board;
coupling a second outer conductive contact pad to a second circuit board to encircle a second inner conductive contact pad, the second inner conductive contact pad coupled to the second circuit board and defining a second switch element of the second circuit board;
positioning a first end of a sheet member along the first circuit board;
positioning a second end of the sheet member along the second circuit board;
applying a layer of conductive adhesive over the first outer conductive contact pad;
folding the sheet member such that the second circuit board is positioned above the first circuit board and the layer of conductive adhesive contacts the second outer conductive contact pad to enclose the first and second switch elements; and
positioning a button that defines a user input surface over the first and second circuit boards.

8. The method of forming a switch assembly of claim 7, further comprising:
a controller electrically coupled to a terminal in the first circuit board, and wherein the controller is operative to measure a change in a capacitance value and close at least one circuit in response to the measured change.

9. An electronic device, comprising:
a housing comprising an opening therethrough;
a button positioned in the opening;
a collapsible dome positioned below the button;
a circuit board;
an inner contact pad coupled to the circuit board and defining a switch element;
a first outer conductive contact pad coupled to the circuit board and encircling the switch element;
a sheet member having first and second ends, the first end extending from the circuit board and the second end positioned along a bottom surface of the collapsible dome, the sheet member including a folded portion connecting the first and second ends;
a second outer conductive contact pad coupled to the sheet member at the first end; and
a layer of conductive adhesive between the first outer conductive pad and the second outer conductive pad, wherein:
the layer of conductive adhesive provides an electrical connection between the first outer conductive pad and the second outer conductive pad; and
the second end of the sheet member and the switch element are configured to contact one another in response to a depression of the button, thereby triggering a switch event.

10. The electronic device of claim 9, wherein the first and the second outer conductive contact pads are at least partially ring shaped and the layer of conductive adhesive is a ring of conductive adhesive between the first and the second outer conductive contact pads.

11. The electronic device of claim 9, wherein the first and second outer conductive contact pads are copper coated.

12. The electronic device of claim 9, wherein the layer of conductive adhesive prevents corrosive elements from coming in to contact with the switch.

13. The electronic device of claim 9, wherein the layer of conductive adhesive forms a water resistant seal around the switch elements.

14. The electronic device of claim 9, wherein the layer of conductive adhesive comprises a conducive silicon glued to the circuit board.

15. The electronic device of claim 9, wherein:
the switch element is a first conductor of a capacitor; and
the electronic device further comprises:
 a terminal positioned at the second end conductor of the capacitor; and a controller operative to measure a change in capacitance of the capacitor and close at least one circuit in response to the measured change.

\* \* \* \* \*